United States Patent
Baker et al.

(10) Patent No.: US 11,923,131 B2
(45) Date of Patent: Mar. 5, 2024

(54) PRODUCTS AND APPLICATIONS FOR THE TEMPLATED FABRICATION OF MATERIALS USING COLD SPRAY DEPOSITION

(71) Applicants: Lawrence Livermore National Security, LLC, Livermore, CA (US); Richard Thuss, Berryville, VA (US)

(72) Inventors: Alexander Baker, Pleasanton, CA (US); Scott K. McCall, Livermore, CA (US); Harry B. Radousky, San Leandro, CA (US); Nathan Woollett, Pleasanton, CA (US); Richard Thuss, Berryville, VA (US)

( * ) Notice: Subject to any disclaimer, the term of this patent is extended or adjusted under 35 U.S.C. 154(b) by 436 days.

(21) Appl. No.: 17/096,699

(22) Filed: Nov. 12, 2020

(65) Prior Publication Data
US 2022/0148802 A1    May 12, 2022

(51) Int. Cl.
*H01F 7/02*    (2006.01)
*B22F 10/25*    (2021.01)
(Continued)

(52) U.S. Cl.
CPC .............. *H01F 41/14* (2013.01); *B22F 10/25* (2021.01); *B22F 10/38* (2021.01); *B32B 1/04* (2013.01);
(Continued)

(58) Field of Classification Search
CPC ... H01F 7/00; H01F 7/02; H01F 41/14; H01F 41/20; H01F 41/30; H01F 41/34; B22F 2207/01; B22F 10/25; B22F 10/38; B22F 2999/00; B33Y 80/00; B33Y 10/00; C23C 4/01; C23C 4/08; C23C 4/12; C23C 4/04; C23C 4/06; C23C 24/04; C23C 24/00; C23C 30/00; C23C 30/005; H10N 10/00; H10N 10/01; H10N 10/80; H10N 10/857;
(Continued)

(56) References Cited

U.S. PATENT DOCUMENTS 7,097,885 B2    8/2006    Leonardi et al.
9,306,146 B2    4/2016    Thuss
(Continued)

OTHER PUBLICATIONS

Lawrence Livermore National Laboratory, "Versatile Cold Spray," YouTube video, Jul. 13, 2020, 2 pages, retrieved from https://www.youtube.com/watch?v=inzxhgdEy2s.
(Continued)

*Primary Examiner* — Michael E. La Villa
(74) *Attorney, Agent, or Firm* — Zilka-Kotab, P.C.

(57) ABSTRACT

A product includes an array of cold spray-formed structures. Each of the structures is characterized by having a defined feature size in at least one dimension of less than 100 microns as measured in a plane of deposition of the structure, at least 90% of a theoretical density of a raw material from which the structure is formed, and essentially the same functional properties as the raw material. A product includes a cold spray-formed structure characterized by having a defined feature size in at least one dimension of less than 100 microns as measured in a plane of deposition of the structure, at least 90% of a theoretical density of a raw material from which the structure is formed, and essentially the same functional properties as the raw material.

26 Claims, 10 Drawing Sheets

(51) Int. Cl.
| | |
|---|---|
| B22F 10/38 | (2021.01) |
| B32B 1/04 | (2006.01) |
| B32B 3/02 | (2006.01) |
| B32B 3/26 | (2006.01) |
| B32B 3/30 | (2006.01) |
| B32B 5/14 | (2006.01) |
| B32B 5/16 | (2006.01) |
| B32B 7/025 | (2019.01) |
| B32B 7/027 | (2019.01) |
| B32B 15/04 | (2006.01) |
| B33Y 80/00 | (2015.01) |
| C23C 4/01 | (2016.01) |
| C23C 4/04 | (2006.01) |
| C23C 4/06 | (2016.01) |
| C23C 4/08 | (2016.01) |
| C23C 4/12 | (2016.01) |
| C23C 24/00 | (2006.01) |
| C23C 24/04 | (2006.01) |
| C23C 30/00 | (2006.01) |
| H01F 7/00 | (2006.01) |
| H01F 41/14 | (2006.01) |
| H01F 41/20 | (2006.01) |
| H01F 41/30 | (2006.01) |
| H01F 41/34 | (2006.01) |
| H10N 10/00 | (2023.01) |
| H10N 10/80 | (2023.01) |
| H10N 10/857 | (2023.01) |
| H10N 15/00 | (2023.01) |
| H10N 30/00 | (2023.01) |
| H10N 30/01 | (2023.01) |
| H10N 30/074 | (2023.01) |
| H10N 30/076 | (2023.01) |
| H10N 60/00 | (2023.01) |
| H10N 60/01 | (2023.01) |
| B33Y 10/00 | (2015.01) |
| H10N 10/01 | (2023.01) |

(52) U.S. Cl.
CPC ............... *B32B 3/02* (2013.01); *B32B 3/26* (2013.01); *B32B 3/30* (2013.01); *B32B 5/14* (2013.01); *B32B 5/142* (2013.01); *B32B 5/145* (2013.01); *B32B 5/16* (2013.01); *B32B 7/025* (2019.01); *B32B 7/027* (2019.01); *B32B 15/04* (2013.01); *B32B 15/043* (2013.01); *B33Y 80/00* (2014.12); *C23C 4/01* (2016.01); *C23C 4/04* (2013.01); *C23C 4/06* (2013.01); *C23C 4/08* (2013.01); *C23C 4/12* (2013.01); *C23C 24/00* (2013.01); *C23C 24/04* (2013.01); *C23C 30/00* (2013.01); *C23C 30/005* (2013.01); *H01F 7/00* (2013.01); *H01F 7/02* (2013.01); *H01F 41/20* (2013.01); *H01F 41/30* (2013.01); *H01F 41/34* (2013.01); *H10N 10/00* (2023.02); *H10N 10/80* (2023.02); *H10N 10/857* (2023.02); *H10N 15/00* (2023.02); *H10N 30/00* (2023.02); *H10N 30/01* (2023.02); *H10N 30/074* (2023.02); *H10N 30/076* (2023.02); *H10N 30/1051* (2023.02); *H10N 60/00* (2023.02); *H10N 60/01* (2023.02); *B22F 2999/00* (2013.01); *B33Y 10/00* (2014.12); *C22C 2202/00* (2013.01); *H10N 10/01* (2023.02); *Y10T 428/12389* (2015.01); *Y10T 428/12396* (2015.01); *Y10T 428/12458* (2015.01); *Y10T 428/12493* (2015.01); *Y10T 428/12528* (2015.01); *Y10T 428/12535* (2015.01); *Y10T 428/12681* (2015.01); *Y10T 428/24942* (2015.01); *Y10T 428/249921* (2015.04); *Y10T 428/26* (2015.01)

(58) Field of Classification Search
CPC ...... H10N 15/00; H10N 30/00; H10N 30/074; H10N 30/1051; H10N 30/01; H10N 30/076; H10N 60/00; H10N 60/01; C22C 2202/02; C22C 2202/00; B32B 1/04; B32B 3/02; B32B 3/26; B32B 3/30; B32B 5/14; B32B 5/142; B32B 5/145; B32B 5/16; B32B 7/025; B32B 7/027; B32B 15/04; B32B 15/043; Y10T 428/12389; Y10T 428/12396; Y10T 428/12458; Y10T 428/12493; Y10T 428/12528; Y10T 428/12535; Y10T 428/12681
See application file for complete search history.

(56) References Cited

U.S. PATENT DOCUMENTS

| | | |
|---|---|---|
| 10,714,671 B2 | 7/2020 | Thuss |
| 2006/0121187 A1 | 6/2006 | Haynes et al. |
| 2006/0222862 A1 | 10/2006 | Akedo et al. |
| 2014/0305479 A1* | 10/2014 | Nemir ............... H10N 10/17 438/54 |
| 2018/0204677 A1 | 7/2018 | Celik |
| 2020/0157689 A1 | 5/2020 | Mccall et al. |

OTHER PUBLICATIONS

Baker et al., "Cold Spray Deposition of Thermoelectric Materials," Advanced Processing and Additive Manufacturing of Functional Magnetic Materials, vol. 72, No. 8, Apr. 8, 2020, pp. 2853-2859.
Fabrice et al., "Metal-NdFeB composite permanent magnets produced by cold spray," 29th World Electric Vehicle Symposium and Exhibition (EVS29), Jun. 2016, 11 pages.
Lamarre et al., "Permanent Magnets Produced by Cold Spray Additive Manufacturing for Electric Engines," Journal of Thermal Spray Technology, vol. 28, 2019, pp. 1709-1717.
Baker, A., "Cold Spray Additive Manufacturing of Thermoelectric Materials," Lawrence Livermore National Laboratory, Presentation at the 5th Symposium on Advanced Materials for Energy Conversion and Storage Functional Materials Including High-Temperature Ceramics and Alloys, Mar. 12, 2019, 27 pages.
Brown et al., "Developments in the processing and properties of NdFeb-type permanent magnets," Journal of Magnetism and Magnetic Materials, vol. 248, 2002, pp. 432-440.
Bance et al., "Micromagnetics of shape anisotropy based permanent magnets," Journal of Magnetism and Magnetic Materials, vol. 363, Aug. 2014, pp. 121-124.
Li et al., "Fabrication of highly dense isotropic Nd—Fe—B nylon bonded magnets via extrusion-based additive manufacturing," Additive Manufacturing, vol. 21, 2018, pp. 495-500.
Zhou et al., "On spinodal decomposition in alnico—A transmission electron microscopy and atom probe tomography study," Acta Materialia, Apr. 2018, pp. 15-22.
McCall et al., U.S. Appl. No. 16/684,441, filed Nov. 14, 2019.
Lamarre et al., "Permanent Magnets Produced by Cold Spray Additive Manufacturing for Electric Engines," Journal of Thermal Spray Technology, Sep. 19, 2019, 9 pages.
Glass et al., "Magnetostrictive Cold Spray Sensor for Harsh Environment and Long-Term Condition Monitoring," 45th Annual Review of Progress in Quantitative Nondestructive Evaluation, vol. 38, AIP Conference Proceedings 2102, May 8, 2019, pp. 020018-1: 020018-8.
Lou et al., "Electroststically tunable magnetoelectric inductors with large inductance tunability," Applied Physics etters, vol. 94, No. 112508, Mar. 19, 2009, p. 112508-1: 112508-3.
Bernier et al., "Metal-NdFeB composite permanent magnets pro-

(56) References Cited

OTHER PUBLICATIONS duced by cold spray," EVS29 International Battery, Hybrid and Fuel Cell Electric Vehicle Symposium, Jun. 19-22, 2016, pp. 1-9.
Engineering, "Cold Spray Additive Offers New Fabrication Process for Permanent Magnets," Engineering.com, Jan. 26, 2018, 7 pages, retrieved from https://www.engineering.com/AdvancedManufacturing/ArticleID/16398/Cold-Spray-Additive-Offers-New-Fabrication-Process-for-Permanent-Magnets.aspx.
Magnequench, "Magnequench is the industry leader in bonded neo magnetic powders, magnets, and their applications," Magnequench International LLC, accessed on Nov. 14, 2019, 6 pages, retrieved from https://mqitechnology.com/.
Metal Am, "Permanent magnets for electric motors by cold spray Additive Manufacturing," Inovar Communications Ltd, Jan. 26, 2018, 6 pages, retrieved from https://www.metal-am.com/permanent-magnets-electric-motors-cold-spray-additive-manufacturing/.
Watkin, H., "Researchers Create Permanent Magnets with Cold Spray Additive Manufacturing," All3DP, Jan. 29, 2018, retrieved from https://all3dp.com/researchers-create-permanent-magnets-cold-spray-additive-manufacturing/.
McCall et al., "Temperature and Field Induced Strain Measurements in Single Crystal Gd5Si2Ge2," Journal of The Minerals, Metals & Materials Society, vol. 68, No. 6, Mar. 29, 2016, pp. 1589-1593.
U.S. Appl. No. 16/399,560, filed Apr. 30, 2019.
International Search Report and Written Opinion from PCT Application No. PCT/US2019/061773, dated Mar. 10, 2020.
U.S. Appl. No. 16/894,098, filed Jun. 5, 2020.
U.S. Appl. No. 63/064,972, filed Aug. 13, 2020.
U.S. Appl. No. 63/093,744 filed Oct. 19, 2020.

\* cited by examiner

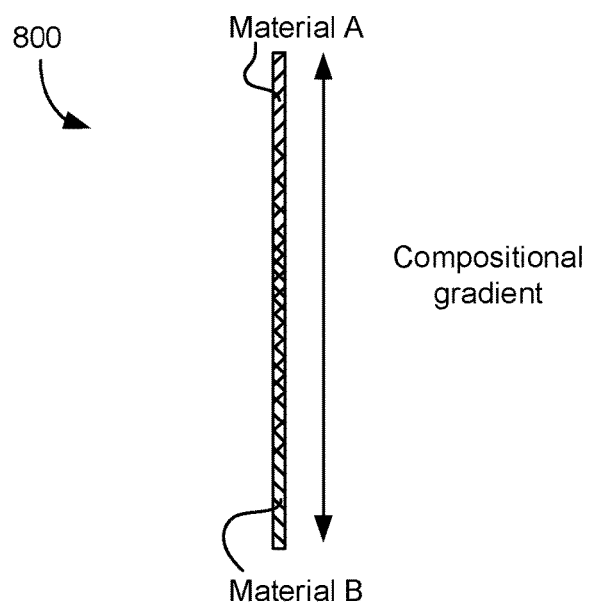
FIG. 8
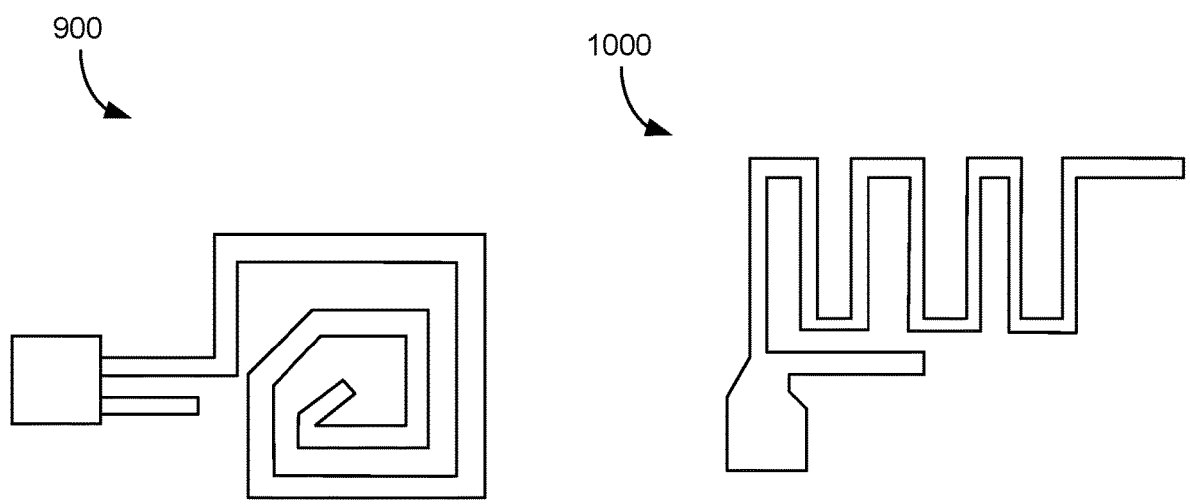
FIG. 9
FIG. 10

PRODUCTS AND APPLICATIONS FOR THE TEMPLATED FABRICATION OF MATERIALS USING COLD SPRAY DEPOSITION

FIELD OF THE INVENTION

The present invention relates to products created by additive manufacturing, and more particularly products created by cold spray deposition. In particular, this invention relates to products and applications for the templated fabrication of materials using cold spray deposition.

BACKGROUND

Cold spray deposition of coatings is widely used across industry for corrosion-resistant claddings and localized repair. In various techniques, micron-scale particles are entrained in supersonic gas (typically He or $N_2$) and directed onto a metal surface. Upon impact, the particles plastically deform and bond with the surface or one another, with deposition efficiency controlled by the particle speed and ductility. Cold spray deposition can achieve fine features using control of nozzle shape or by selectively covering portions of the substrate. Due to the requirements for plastic deformation, cold spray deposition has been limited to malleable materials, making it well suited for structural elements and alloys but traditionally unsuitable for depositing devices or active elements composed of functional materials which are typically brittle materials.

Other additive manufacturing techniques known in the art have further limitations for use with functional materials. For example, most rare earth element permanent magnets are produced through a process that includes producing sintered powders. Many additive approaches to powder metallurgy involve directed energy beams which melt the powder, thereby destroying the desired grain structure.

Current magnet manufacturing proceeds through crystal growth, grinding, pressing, aligning and sintering, an inherently wasteful process exacerbated by the extreme brittleness of the materials involved, such that generally over 25% for bulk parts, rising to 50% for millimeter scale components or up to 90% for prototypes of the material, is lost when making millimeter scale parts. In addition, many proprietary optimization steps need to be performed to improve the high-temperature performance of the magnets, including grain boundary diffusion of dopants and careful control of particle size.

Additive manufacturing approaches such as binder inkjetting, direct ink write and selective laser melting all seek to address this process, but each introduce their own limitations. For example, the high volume fraction of binder (~30%) significantly reduces the energy density of the magnets, while laser melting destroys the delicate microstructure essential to good magnetic properties and other functionalities.

SUMMARY

Cold spray deposition, according to the various aspects described herein, by contrast, does not generally melt the powders and so the microstructure can largely be preserved intact, enabling functional materials dependent on the details of the microstructure, such as coercivity in permanent magnets or structural materials where finer grains show improved yield strength (e.g., via the Hall-Petch relationship). Described herein are new cold spray fabrication techniques for creating structures with very fine feature size and precise dimensions.

A product, according to one aspect, includes an array of cold spray-formed structures. Each of the structures is characterized by having a defined feature size in at least one dimension of less than 100 microns as measured in a plane of deposition of the structure, at least 90% of a theoretical density of a raw material from which the structure is formed, and essentially the same functional properties as the raw material.

A product, according to one aspect, includes a cold spray-formed structure characterized by having a defined feature size in at least one dimension of less than 100 microns as measured in a plane of deposition of the structure, at least 90% of a theoretical density of a raw material from which the structure is formed, and essentially the same functional properties as the raw material.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 8 is a top down view perpendicular to the plane of deposition of an exemplary cold spray-formed fine feature, according to one aspect of an inventive concept.

FIG. 9 is a top down view perpendicular to the plane of deposition of an exemplary cold spray-formed fine feature, according to one aspect of an inventive concept.

FIG. 10 is a top down view perpendicular to the plane of deposition of an exemplary cold spray-formed fine feature, according to one aspect of an inventive concept.

DETAILED DESCRIPTION

Figure 1:
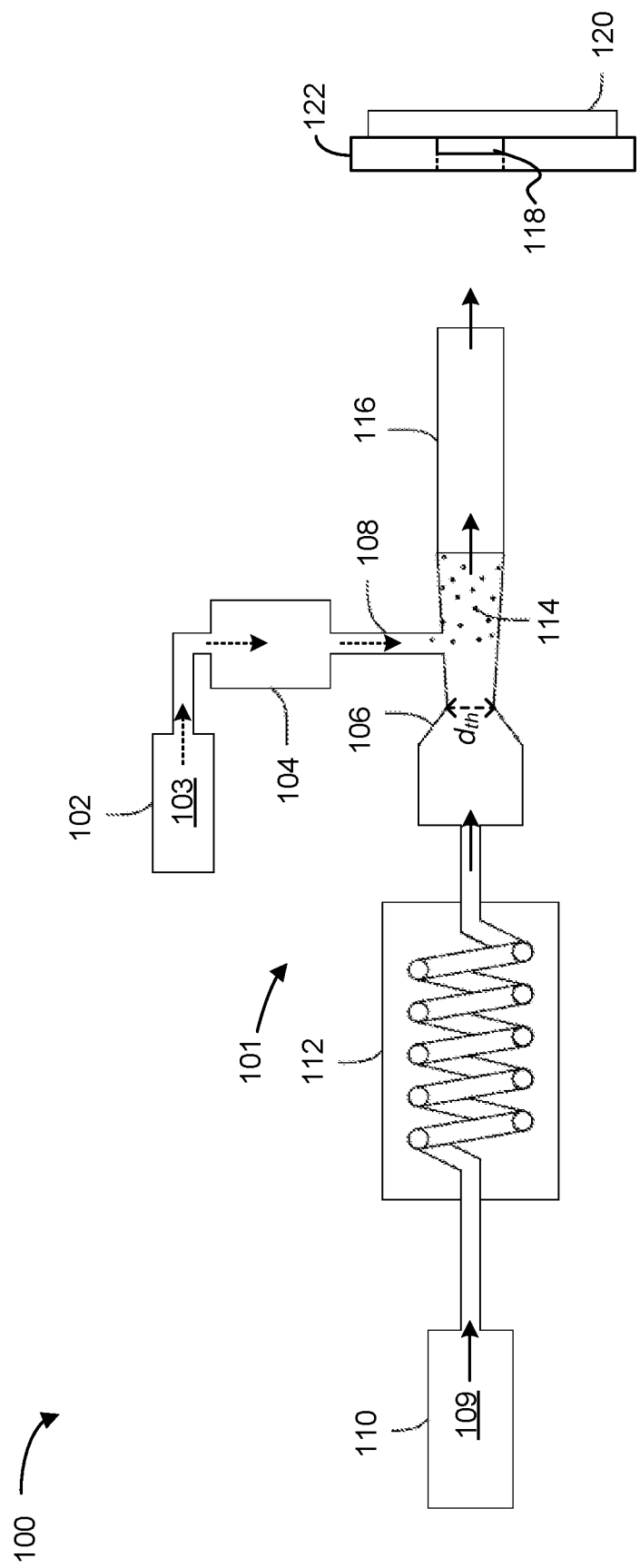
FIG. 1 is a schematic drawing of an apparatus used for cold spray deposition of a material, according to one aspect of an inventive concept.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

As also used herein, the term "about" denotes an interval of accuracy that ensures the technical effect of the feature in question. In various approaches, the term "about" when combined with a value, refers to plus and minus 10% of the reference value. For example, a thickness of about 10 nm refers to a thickness of 10 nm±1 nm, a temperature of about 50° C. refers to a temperature of 50° C.±5° C., etc.

It is noted that ambient room temperature may be defined as a temperature in a range of about 20° C. to about 25° C.

It is also noted that, as used in the specification and the appended claims, wt % is defined as the percentage of weight of a particular component is to the total weight/mass of the mixture. Vol % is defined as the percentage of volume of a particular compound to the total volume of the mixture or compound. Mol % is defined as the percentage of moles of a particular component to the total moles of the mixture or compound. Atomic % (at %) is defined as a percentage of one type of atom relative to the total number of atoms of a compound.

As described herein, "substantially" is used as an approximation to a significant extent, as would be understood by one skilled in the art. Additionally, as described herein, "essentially" is used as an approximation to a significant extent of similarity (e.g., such that any changes or differences are negligible).

A nanoscale is defined as having a diameter or length less than 1000 nanometers (nm).

The following description discloses several preferred embodiments of templated fabrication of materials using cold spray deposition and/or related systems and methods.

In one general aspect, a product includes an array of cold spray-formed structures. Each of the structures is characterized by having a defined feature size in at least one dimension of less than 100 microns as measured in a plane of deposition of the structure, at least 90% of a theoretical density of a raw material from which the structure is formed, and essentially the same functional properties as the raw material.

In another general aspect, a product includes a cold spray-formed structure characterized by having a defined feature size in at least one dimension of less than 100 microns as measured in a plane of deposition of the structure, at least 90% of a theoretical density of a raw material from which the structure is formed, and essentially the same functional properties as the raw material.

Cold spray deposition is an additive manufacturing (AM) technique that may be used to deposit functional materials such as permanent magnets, thermoelectrics, etc., without affecting their functional properties according to at least some of the aspects described herein. Cold spray is a technique where fine powders including particles (e.g., having a diameter of about 5 microns ($\mu$m) to about 50 $\mu$m) are entrained in a carrier gas stream and accelerated to supersonic velocities where the particles may be deposited onto a substrate. The particles may be directed onto a surface where the particles adhere to the surface and each other thereby enabling structures to be built. Traditionally, cold spray has been limited to the realm of ductile particles. Upon contact, the particles undergo localized shear straining and localized heating which enables the deposited particles to deform and adhere thereby resulting in the formation of structures approaching full density.

Cold spray has been widely used for patching, repair, coating, and metal-AM, but deployment to functional materials beyond purely structural materials is limited. Functional materials may include materials which respond to an external stimulus in at least some approaches. In other approaches, functional materials may include "functionalized coatings" having corrosion resistance layers. For example, a functionalized coating may include Cr bearing metal composites or similar composites as would be understood by one having ordinary skill in the art. Recent work has expanded cold spray applications to brittle functional materials, including fine and microfeature depositions, but the work herein presents numerous innovative material type and feature shape applications. Furthermore, the various aspects described herein advantageously provide binder-free deposition of these fine features including brittle, functional, crystalline, etc., materials.

The advantages of cold spray include the ability to produce complex shapes, and the ability to deposit materials on complex surfaces (e.g., around the exterior surface of a pipe). In one approach, the cold spray method of forming the material causes the particles of the precursor powder to adhere to the substrate and other already-deposited particles without an additive, e.g., an adhesion factor, binder, etc.

Cold spraying, according to various approaches, includes pressurizing a gas to a pressure in a range of about 60 pound-force per square inch (psi) to about 200 psi (e.g., about 0.4 MPa to about 1.4 MPa), but the pressure could be higher or lower in some approaches. For example, in one approach, the pressure for the cold spray process is about 100 psi. In another approach, a nitrogen gas may be pressurized from about 0.5 MPa to about 0.9 MPa.

In various approaches, gases used for the supersonic gas flow include any conventional gas used in cold spray. Examples include, but are not limited to, nitrogen ($N_2$) gas, helium (He) gas, xenon (Xe) gas, hydrogen ($H_2$) gas, argon (Ar) gas, compressed air, and combinations thereof.

In some approaches, gases may be included to prevent oxidation by acting as a reducing agent. Exemplary examples of gases to prevent oxidation include carbon monoxide (CO), carbon dioxide ($CO_2$), ammonia ($NH_3$), etc. In other approaches, the gas may include a forming gas. For example, and not meant to be limiting in any way, a forming gas may include a non-explosive mixture of hydrogen and nitrogen.

Various aspects of the present disclosure introduce a mask between the spray nozzle and the substrate for forming products according to at least some of the embodiments disclosed herein. The mask preferably templates the shapes that are deposited, thereby creating fine-featured products with dimensions on the order of tens of microns. Arrays of shapes may be deposited over a wide area by creating a relative motion between the substrate and spray nozzle, e.g., by scanning the substrate and/or spray nozzle.

In at least some approaches, the confined dimensions (e.g., which are characteristic of the masking process described herein) of the sprayed material may be used to impose shape anisotropy on permanent magnets, thereby increasing their coercivity and generating a preferred orientation. In other approaches, the demagnetization tensor of superconducting materials may be controlled to dramatically enhance magnetization in response to an external field applied in a given direction.

In yet other approaches, sequential deposition of p-type and n-type thermoelectrics, and, in some approaches, conductive connection layers, creates arrays of energy harvesting units. For example, a mask may be used in the deposition of the p-type thermoelectric and then the mask (and/or the nozzle) may be translated to deposit the n-type thermoelectric. The sequential deposition of p-type and n-type thermoelectrics, and, in at least some approaches, conductive connection layers, may be used to exploit the layered thermoelectric concept by tailoring the operating temperature window of each layer.

The fine-featured products as described in detail herein are difficult or impossible to fabricate using conventional approaches. Competing AM techniques which may produce similar feature sizes typically destroy the functional properties of the material, or do not allow near-full density fabrication. Functional materials such as permanent magnets or thermoelectrics tend to be brittle, making them challenging to cut to shape using traditional manufacturing approaches. For example, for permanent magnets, loss due to swarfs and breakages can exceed 60% when cutting to sub-mm sizes, as is required for miniature actuators (e.g., for use in earbud speakers, etc.). This loss limits the range of devices that can be fabricated from these materials, and also inflates the cost of these devices.

According to at least some aspects discussed herein, it is possible to achieve enhanced properties by tailoring the shape of the magnets. For example, AlNiCo's coercivity arises from nanoscale high-aspect ratio phases that form within the matrix, and micron-scale rectangular grains are preferred in high-performance NdFeB magnets. The magnetization of the particle prefers to align along the long axis, imposing an additional temperature independent anisotropy that can enhance coercivity of the magnet. However, conventional techniques are not capable of achieving this level of fidelity in fabrication, particularly in the about 1 micron to about 100 micron feature size range.

Previous efforts to make micron-scale functional materials of tailored shapes (e.g., fine features) have focused on top-down or bottom-up approaches. The classical top-down approach includes taking a bulk crystal and reducing the size of the crystal using traditional subtractive manufacturing techniques including slicing, grinding, polishing, etc. The brittle nature of many functional materials makes achieving small product sizes (e.g., less than 100 microns) challenging. Smaller sizes become impractical, labor intensive, and the throughput of these techniques are low.

When pursuing very fine feature sizes, another conventional approach uses a large-area deposition technique such as sputtering to deposit a thick layer of material before applying subtractive lithographic techniques such as focused ion beam etching or photoresists followed by wet chemical etching to remove extra material. This has been successful in some cases, but the high cost of such lithography limits applications to a few hundred nm thickness, particularly when cleanroom requirements and throughput limitations are considered.

Alternatively, bulk synthesis is capable of forming high-aspect ratio particles/phases in a matrix through the use of techniques such as hot isostatic pressing, directional solidification, or casting in a magnetic field. AlNiCo is an example of such a material, where a spinoidal decomposition results in formation of a periodic, elongated Co-containing nanostructure within a nonmagnetic Al—Ni matrix which gives rise to shape anisotropy, and, therefore, coercivity. This technique is limited to AlNiCo and related crystal structures where a spinoidal exists, however, and is not applicable to high-performance permanent magnets such as NdFeB, where magnetocrystalline anisotropy is the primary driver of coercivity. Furthermore, it is extremely difficult to extract the high aspect ratio, rod-shaped particles from the matrix, making this approach unsuitable for fabricating small magnets.

Bottom-up approaches include wet-chemical synthesis of nanoparticles in combination with additive manufacturing techniques such as laser powder bed fusion (LPBF) or direct ink write (DIW). Wet chemical synthesis can achieve high aspect ratio rods, but it is hard to reach length scales of tens of microns with this method. Furthermore, the functional properties of many materials of interest typically rely on a complex microstructure, which can only be achieved using complicated crystal growth processes. LPBF can fabricate parts with fine feature sizes on the ~100 micron length scale, but melting of the powder destroys the tailored crystal structure that gives rise to the functional properties, rendering the resulting parts useless. DIW preserves this crystal structure as it binds particles in ink to achieve flowability, but feature sizes are limited by the flow dynamics of the fluid through the nozzle.

Mask templated cold spray as disclosed herein overcomes the foregoing limitations by allowing rapid deposition of functional materials with feature sizes on the scale of tens of microns. Specifically, at least some of the aspects described herein form products having fine features (e.g., structures) which are preferably less than 100 microns in width at narrowest points thereof, with feature sizes potentially down to about the average diameter of the particles being deposited. Introducing a mask between the spray nozzle and the substrate creates shadowed regions where no material is deposited, effectively allowing negatives of the mask to be built up. The high pressure gas used in cold spray clears away non-adhered powder, e.g., from the mask and/or substrate, thereby preventing unwanted accumulation. Periodic structures can be created using a repeating mask, or a single structure can be deposited using a more complicated mask arrangement in at least some approaches. The technique is analogous to spraying through a stencil, with the added benefit that material that does not adhere can be collected and reused in at least one approach. The resolution limits are imposed by a combination of the size of the particle to be sprayed (typically less than 10 microns in diameter on average) and the ability to fabricate robust masks.

Functional materials which may be sprayed as the raw material in the cold spray system include $Nd_2Fe_{14}B$, $Bi_2Te_3$, Mn-ferrite, YBCO, MnFePSi, etc. Additional raw materials which may be sprayed as the raw material in the cold spray system include ceramics, magnetic materials, ferrites, superconductors, piezoelectrics, etc. In various approaches, the raw materials are sprayed as particles. The average diameter of the particles of raw materials are preferably in a range of about 0.2 microns to about 10 microns.

In various aspects, the mask material may include any suitable material that would become apparent to one skilled in the art upon reading the present disclosure. In one approach, the mask material is metal, e.g., a screen, an etched metal sheet having a periphery, apertures (cutouts) therethrough, etc., that define the desired unshadowed area on the substrate. In various approaches, the mask material is a metal including copper, steel, etc. In another approach, the mask material includes a screen composed of a series of interlocking metal wires. In another example, a mask may be tape having a periphery, cutouts, etc., that define the desired shadowed area on the substrate. In some approaches, the mask may be formed by photolithography, e.g., of photoresist using conventional techniques. Additional illustrative mask materials include ceramics or coated fibers. In one aspect, the substrate itself may be used as a template by preferentially roughening certain areas to improve adhesion of the particles of the raw material(s). After deposition, the material remains only in the roughened areas. This roughening can be accomplished using chemical approaches, or by spraying a non-adhering particle through one of the aforementioned masks.

In at least one approach, the mask may be recovered for reuse. For example, an acid etch treatment may be used to remove any consolidated material which remains on the mask after spraying the raw material particles. In some approaches, the removed materials may be reused and deposited.

In various aspects, the raw materials are cold-sprayed onto a substrate, the substrate including glass, copper, aluminum, ceramics, quartz, steel, organic materials, etc., or any combination thereof. In preferred approaches, the raw materials are cold-sprayed onto a substrate where the fabricated fine-features will be used. For example, the raw materials may be cold-sprayed directly onto a pipe thereby forming a thermoelectric structure for harvesting energy from the pipe and/or the materials flowing within the pipe. In other approaches, the substrate may be an electronics board. In some approaches, the substrate may be a flexible material. For example, the cold spray-formed fine features (e.g., the active elements) may be deposited onto a non-rigid substrate for producing a continuous sheet having increased mechanical flexibility without damaging the cold-sprayed materials.

An example of an apparatus that may be used for mask templating fine features with a supersonic cold spray system is illustrated in FIG. 1. FIG. 1 is a schematic drawing of an apparatus used for cold spray deposition of a material. FIG. 1 includes a supersonic cold spray system 100, in accordance with one aspect of an inventive concept. As an option, the present structure of the cold spray system 100 may be implemented in conjunction with features from any other aspect listed herein, such as those described with reference to the other FIGS. Of course, however, such a cold spray system 100 and others presented herein may be used in various applications and/or in permutations which may or may not be specifically described in the illustrative embodiments listed herein. Further, the cold spray system 100 presented herein may be used in any desired environment.

In one approach, and not meant to be limiting in any way, a supersonic cold spray system 100 includes an apparatus 101 which may be used for the supersonic cold spray process as described herein. Pressurizing a gas begins in chamber 110 of the apparatus 101.

In some approaches, the pressurized gas is heated to a temperature below a melting temperature of the material to be deposited, and in many approaches, is heated to near the melting temperature. Gas temperatures in a range of about 250° C. to about 650° C. may be used in some approaches. The gas pressure and gas temperature values may be optimized for the material being sprayed and these parameters may be determinable by one having ordinary skill in the art in view of the present disclosure. In preferred approaches, for magnetic materials, the pressurized gas may be heated to a temperature below the Curie temperature of the magnetic material. As an example, gas temperatures for neodymium iron boride hard magnetic materials may be constrained to be in the range of about 250° C., while gas temperatures for manganese ferrite soft magnetic materials may be as high as about 650° C. As described herein, according to one approach, the pressurized gas temperature may not be limited to the Curie temperature of the magnetic material. The gas temperature limit may be defined by the gas temperature at the particle injection point, which for the apparatus 101, as described in FIG. 1, is significantly lower than the gas temperature entering the throat of the nozzle. In preferred approaches, the temperature is below a temperature that would melt the particles or change the microstructure of the particles.

Preferred gas temperatures at the entrance, shown in the converging-diverging nozzle 106 of FIG. 1 for the cold spray process, may be in a range of about 300° C. to about 500° C., but the temperature may be higher or lower. In some approaches, the temperature may be determined according to the pressure used in the cold spray process as described herein, in a similar manner used in conventional cold spray processes for similar materials. In various approaches, the temperature is preferably below the melting temperature of the powder (e.g., the raw material) used for the cold spray process as described above.

As shown in FIG. 1, the pressurized gas 109 from chamber 110 may be directed (solid arrow) into a heater 112 and heated to a desired temperature.

In one approach, the method may include directing the heated pressurized gas as a gas stream into a nozzle. As shown for apparatus 101 in FIG. 1, the gas 109 may be directed through a converging-diverging nozzle 106 with a throat diameter $d_{th}$ of suitable dimension for the particular material being deposited, e.g., between about 1.0 millimeter (mm) to about 2.5 mm, where the gas may be accelerated to supersonic velocity. In a preferred approach, a throat diameter of a nozzle may be about 1.5 mm. In various approaches, the throat diameter may be defined by the material and the application.

In one approach of a cold spray system 100, a low-pressure gas 103 from chamber 102, e.g., air at atmospheric pressure, may be fed (dashed arrow) into a powder feeder 104. The powder feeder 104 may include particles 114 in an average particle size range of about 200 nanometers (nm) to about 10 microns (μm) in diameter. In preferred approaches, the particles 114 are in a particle size range of less than about 10 µm in diameter. The low-pressure gas 103 combines with the particles 114 and the gas 103 carries the particles 114 through a powder entrance tube 108 that may be inserted into a diverging section of the converging-diverging nozzle 106. The low-pressure gas 103 combined with the particles 114 mixes with the gas 109 that has been accelerated to supersonic velocity (solid arrow).

As illustrated in FIG. 1, the particles 114 may be accelerated with the supersonic gas flow of the gas 109 through an extension 116 of the nozzle 106, and directed toward a substrate 120, through a mask 122, where the particles are deposited as a structure 118 having fine features (fine features are not shown in this side view) upon contact with the substrate 120. The mask 122 creates shadowed areas on the substrate 120 where material is not deposited. One or more shaped apertures in the mask 122 allow the particles to pass through the mask 122 in a controlled manner, which in turn results in formation of the structure 118 with features defined by the shape of each aperture in the mask 122. Thus, complex shapes may be fabricated. The mask may have peripheral dimensions larger than the spray diameter of the stream of particles encountering the mask. For example, a typical spray diameter is between about 12 mm and about 15 mm at the substrate. However, the mask allows deposition of structures 118 with features having widths that are less than the spray diameter, e.g., from less than the spray diameter down to less than 100 microns.

As shown, the mask 122 is positioned between the nozzle 106 and the substrate 120. In various approaches, the positioning of the mask between the nozzle and the substrate (e.g., the distance between the mask and the nozzle, the distance between the mask and the substrate, etc.) may be optimized as would become apparent to one having ordinary skill in the art upon reading the present disclosure. For example, depositing thicker films may include retreating the substrate relatively further from the mask to maintain a fixed distance between the nozzle, the mask, and the plane of deposition.

Further examples of process parameters and materials that may be incorporated into various embodiments presented herein are described in various aspects of U.S. patent application Ser. No. 16/399,560 and U.S. patent application Ser. No. 14/107,143, which are herein incorporated by reference.

It should become apparent to one having ordinary skill in the art upon reading the present disclosure that the various temperature, pressure, humidity, gas velocity, etc., parameters are dependent on the raw material which is being sprayed and/or the substrate the raw material is being deposited onto. The foregoing parameters would be determinable and tunable by one having ordinary skill in the art for intended applications in view of the teachings of the present disclosure. Moreover, conventional cold spray techniques may be employed in some approaches, with the novel addition of the mask.

In preferred aspects, a product comprising a cold spray-formed structure is characterized by having a defined feature size in at least one dimension of less than 100 microns as measured in a plane of deposition. The defined feature size is preferably defined by the template (e.g., the mask) in various approaches. For example, the defined feature size in at least one dimension is measured along a plane of deposition which is parallel to the surface of the substrate, or if a curved substrate, the defined feature size in at least one dimension is less than 100 microns as measured along a plane of deposition which is generally tangent to the surface of the substrate.

In one approach, the defined feature size may be measured as an average feature size along a width (e.g., w, see FIGS. 2A-3C) of the fine feature. In another approach, the defined feature size may be measured as an average feature size along a length (e.g., l, see FIGS. 2A-3C) of the fine feature. For example, an average feature size may be calculated based on a plurality of measurements along the width (e.g., w, see FIGS. 2A-3C) and/or the length (e.g., l, see FIGS. 2A-3C) of the fine feature and as average of the plurality of measurements, in at least some approaches.

In contrast, the defined feature size is not measured along the thickness (e.g., t, see FIGS. 2A-3C) of the fine feature and the defined feature size is not measured based on the average feature size along the thickness (e.g., t, see FIGS. 2A-3C) of the fine feature. Specifically, the average feature size is not measured along the thickness (e.g., t, see FIGS. 2A-3C) of the fine feature. Rather, the thickness (e.g., t, see FIGS. 2A-3C) of the fine feature may be any dimension desirable for the intended application as would be determinable by one having ordinary skill in the art upon reading the present disclosure. The deposition thickness of the deposited structure can be controlled by selecting the deposition time.

In various approaches, the product comprising the cold spray-formed structure is characterized by having at least 90%, and preferably greater than 90% (e.g., at least 95%, and more preferably 98%, and ideally greater than 99%) of a theoretical density of a raw material from which the structure is formed. For example, the product comprising the cold spray-formed structure is characterized by having at least 90% of a theoretical density of a raw material (e.g., the material used for cold spray deposition in a state prior to the deposition) is significantly closer to the density of the raw material than a product formed from the same raw material using another additive manufacturing technique.

In various preferred aspects, the product comprising the cold spray-formed structure is characterized by having essentially the same functional properties as the raw material. This characteristic is in stark contrast to products formed by competing AM techniques where the functional properties of the material are typically destroyed during formation due to changes in the crystal structure and/or the density of the raw material compared to the deposited, formed product. The functional properties which are maintained throughout deposition into formation of the product may include the remnant magnetization, coercivity, density, etc., of the raw material. Other functional properties include magnetic permittivity and/or permeability, dielectric polarization, presence of superconductivity, electrical and thermal conductivity, Seebeck effect, magnetoelasticity, magnetocaloric behavior, ferroelectricity, piezoelectricity, response to light through the photoelectric effect, ability to generate currents in response to light for solar cells, functionality as anode and cathode materials in a battery, etc.

Figure 2B:
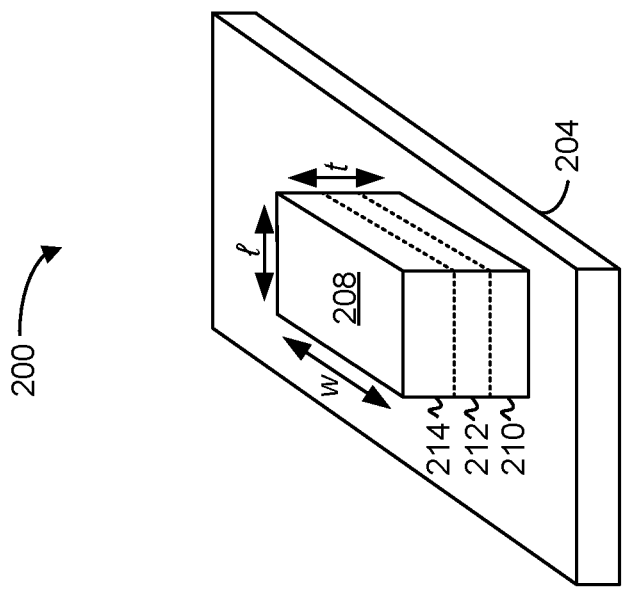
FIG. 2B is a perspective view of an exemplary cold spray-formed structure system, according to one aspect of an inventive concept.
Figure 2A:
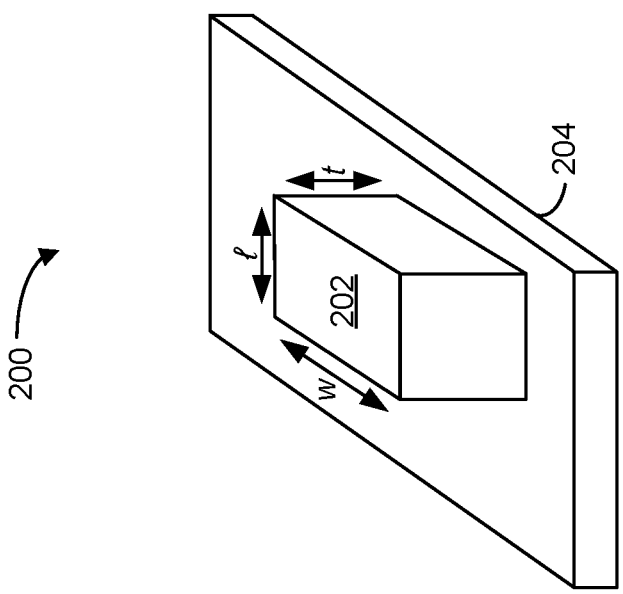
FIG. 2A is a perspective view of an exemplary cold spray-formed structure system, according to one aspect of an inventive concept.

Shapes for the cold spray-formed fine features should not be deemed to be limited to the shapes shown in FIGS. 2A-3D. It should be understood by one having ordinary skill in the art that the cold spray deposition techniques using mask(s) to template fine features may be used to produce any shape known in the art. For example, the cold spray-formed fine feature as shown in FIG. 2A may include any 3-dimensional (3D) shape conceivable to one having ordinary skill in the art for any application, to be described in further detail below with reference to FIGS. 4A-7.

FIG. 2A is a perspective view of an exemplary cold spray-formed structure system 200, in accordance with one embodiment. As an option, the present structure system 200 may be implemented in conjunction with features from any other embodiment listed herein, such as those described with reference to the other FIGS. Of course, however, such structure system 200 and others presented herein may be used in various applications and/or in permutations which may or may not be specifically described in the illustrative embodiments listed herein. Further, the structure system 200 presented herein may be used in any desired environment.

A cold spray-formed structure 202 is defined as having a width, w, length, $\ell$, and thickness, t. The cold spray-formed structure 202 is deposited on a substrate 204 according to the various aspects described herein. It should be understood that a cold spray-formed structure 202 as depicted in FIG. 2A may be single structure in an array of cold spray-formed structures in at least some approaches (see FIG. 3A).

A structure 202 is characterized by having a defined feature size in at least one dimension of less than 100 microns as measured in a plane of deposition, where said plane extends along the $\ell$ and w dimensions in FIG. 2A. In preferred aspects, the plane of deposition is parallel to the surface of the substrate 204. For example, the defined feature size in at least one dimension of less than 100 microns is measured in a plane of deposition which is parallel to the length, $\ell$, of at least the cold spray-formed structure 202 and preferably the surface of the substrate 204. In other aspects, if the surface of the substrate is curved, the plane of deposition is generally tangent to the surface of the substrate.

FIG. 2B is a perspective view of an exemplary cold spray-formed structure system 200, in accordance with one embodiment. As an option, the present structure system 200 may be implemented in conjunction with features from any other embodiment listed herein, such as those described with reference to the other FIGS. Of course, however, such structure system 200 and others presented herein may be used in various applications and/or in permutations which may or may not be specifically described in the illustrative embodiments listed herein. Further, the structure system 200 presented herein may be used in any desired environment.

The structure 202 is defined as having a width, w, length, $\ell$, and thickness, t. The cold spray-formed structure 202 is deposited on a substrate 204 according to the various aspects described herein. It should be understood that a cold spray-formed structure 202 as depicted in FIG. 2B may be single structure in an array of cold spray-formed structures in at least some approaches (see FIG. 3B).

As shown in FIG. 2B, the structure 208 may include a change in composition along a thickness, t, thereof. As shown, structure 208 includes three portions (e.g., portion 210, portion 212, and portion 214), preferably where adjacent portions have different compositions. In at least one approach, the change in composition along a thickness thereof is gradual. In at least one other approach, the change in composition along a thickness thereof is generally sharp from one material to another, e.g., between at least 2 layers, between each of the 3 layers, or any number of transitions between different materials. For example, as shown in FIG. 2B, the change in composition between portion 210 and portion 212 and the change in composition between portion 212 and 214 are considered sharp transitions at each of the dotted lines along the thickness, t, of structure 208.

Each portion of a structure, such as portion 210, portion 212, and portion 214 of structure 208, may be cold-sprayed using a single nozzle system or a multi-nozzle system as would become apparent to one having ordinary skill in the art in view of the present disclosure. For example, a single nozzle system may be used to cold spray a first layer of a structure (e.g., portion 210 of structure 208) and the nozzle may be removed and cleaned. The feed powder may be changed to include the raw materials which comprise the next layer (e.g., portion 212 of structure 208), and so on. Alternatively, the cold spray system may comprise multiple nozzles (e.g., in some approaches, the cold spray system comprises two nozzles, in other approaches, the cold spray system comprises three nozzles, etc.). Each nozzle may be intended for use with a different feed powder and each nozzle may be interchangeable in the cold spray system for relatively quick transitions between spraying the different layers for an intended application.

It should become apparent to one having ordinary skill in the art upon reading the present disclosure that the portions of the structure may have any combination of compositions to fit the intended application. For example, the compositions of a three-layer (e.g., portion) structure may alternate such that a bottom-most layer and a top-most layer (e.g., portion 210 and 214 in FIG. 2B, respectively) include substantially the same composition. In another example, each portion of the structure may include a different composition (e.g., portions 210, 212, and 214 in FIG. 2B each having a different composition). It should also become apparent to one having ordinary skill in the art upon reading the present disclosure that the structure may comprise any number of layers (e.g., portions) and is not limited to the exemplary structure having three portions shown in FIG. 2B.

In at least some approaches, the structure may be a thermoelectric device where the different compositions of each of the portions of the structure are tailored to a particular temperature operating window. A thermoelectric device as referred to herein may be a generator, a sensor, a Peltier cooler, a thermocouple, a thermopile, etc., or any other thermoelectric device known in the art.

In one exemplary approach, a first layer of a thermoelectric device may be formed by depositing a functional material which operates relatively well in a range of about 100° C. to about 200° C. A second layer of the thermoelectric device may be deposited of a second functional material which operates relatively well in a range of about 100° C. to about 50° C., and so on. This exemplary thermoelectric device may therefore be tunable to harvest heat efficiently from the relatively hotter surface to the ambient side of the thermoelectric which radiates heat, thereby harvesting heat across a temperature gradient rather than limiting efficiency to one temperature range. Advantageously, cold spraying thermoelectric devices as described herein do not require any adhesives or binders (e.g., as required by conventional techniques) which increase heat loss and/or introduce flux gaps.

In one exemplary approach, the structure having a change in composition along a thickness, t, thereof may be a permanent magnet. In another exemplary approach, the structure having a change in composition along a thickness, t, thereof may be part of a superconductor. In yet another exemplary approach the structure having a change in composition along a thickness, t, thereof may be part of a piezoelectric device.

In one aspect, the structure has an aspect ratio of orthogonal dimensions in the plane of deposition thereof that is at least 2:1. In one exemplary approach, the foregoing structure may be a permanent magnet. In another exemplary approach, the foregoing structure may be part of a superconductor.

In some approaches, for magnetic materials formed according to any of the aspects described herein, a solenoid coil and/or permanent magnet may be used to rotate the particles of the raw material as the particles are cold-sprayed such that when the particles are deposited on the substrate, the crystal structures of the particles are aligned (e.g., pointing in the same direction) for tuning the magnetic coercivity. Any external field may be applied to the particles as the particles are cold-sprayed.

It should be noted that any product comprising a cold spray-formed structure as discussed herein may include a plurality of cold spray-formed structures on a substrate. For example, in one approach, a product comprises an array of cold spray-formed structures each being characterized by having a defined feature size in at least one dimension of less than 100 microns as measured in a plane of deposition of the structure, as described above, and at least 90%, and preferably greater, of a theoretical density of a raw material from which the structure is formed, as described above. In a preferred aspect, the product comprises an array of cold spray-formed structures where each of the structures is characterized as having essentially the same functional properties as the raw material.

In various approaches, arrays of cold spray-formed structures may be advantageously serially cold-sprayed using the masking techniques described herein to cover a relatively large area with the formed, fine features. The combination of the mask and the cold spray techniques for forming these fine features produce products that were previously difficult, if not impossible, to obtain relatively quickly.

Figure 3A:
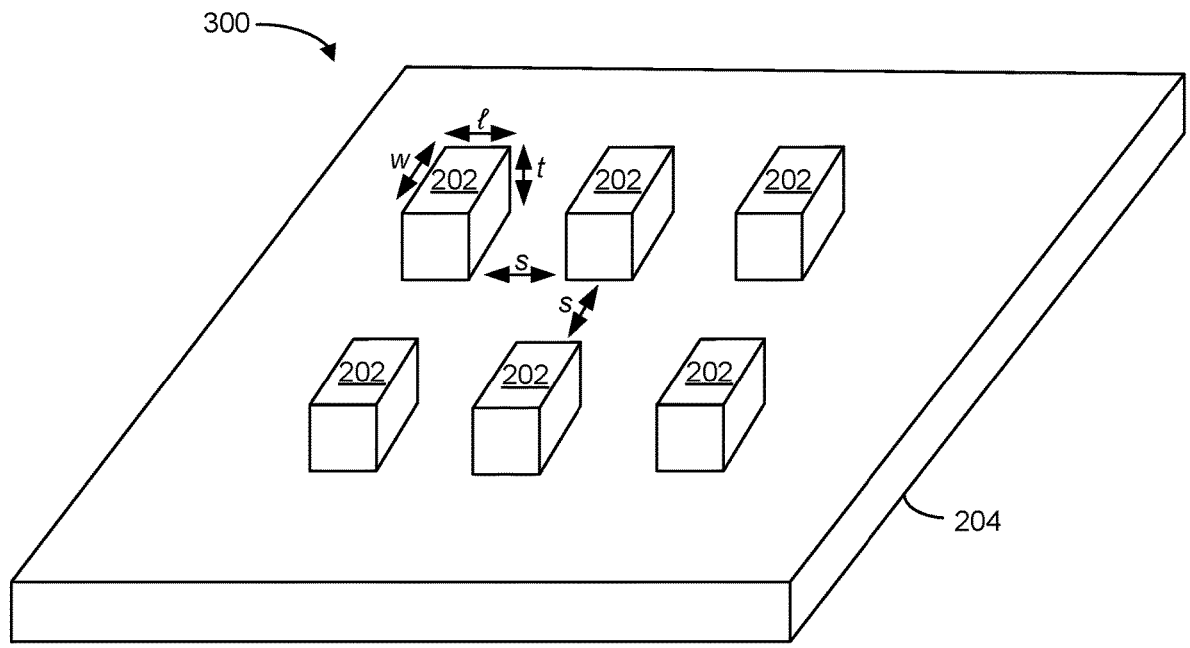
FIG. 3A is a perspective view of an exemplary product comprising an array of cold spray-formed structures, according to one aspect of an inventive concept.

A perspective view of an exemplary product comprising an array of cold spray-formed structures is shown in FIG. 3A, in accordance with one embodiment. As an option, the present product 300 may be implemented in conjunction with features from any other embodiment listed herein, such as those described with reference to the other FIGS. Of course, however, such product 300 and others presented herein may be used in various applications and/or in permutations which may or may not be specifically described in the illustrative embodiments listed herein. Further, the product 300 presented herein may be used in any desired environment.

As shown, the product 300 comprises an array of cold spray-formed structures. Each cold spray-formed structure 202 may be a cold spray-formed structure as described in FIG. 2A. In an alternative approach, each cold spray-formed structure may be a cold spray-formed structure as described with reference to FIG. 2B (see structure 208). In yet another approach, the product may comprise a variety of cold spray-formed structures as described in FIGS. 2A-2B (see FIG. 3B, to be discussed in detail below). The array of cold spray-formed structures is deposited on the substrate 204 via a cold spray system as described above having a nozzle and a mask which defines the boundaries of the fine-featured, cold spray-formed structures 202.

The structures 202 are separated by a separation, s. In at least some approaches, the separation, s, is about 10 microns. In other approaches, the separation, s, may be greater than or less than about 10 microns, depending on the intended application. The separation, s, in a direction which is parallel to the length, l, may be the same as the separation, s, in a direction which is parallel to the width, w, as shown. In other approaches, the separation, s, in a direction which is parallel to the length, l, may be different from the separation, s, in a direction which is parallel to the width, w. For example, in yet other approaches, rows of fine features (e.g., structures) may be offset such that the fine features are not aligned in straight, up and down columns, as shown.

In one approach, the array of cold spray-formed structures is formed without relative motion between the substrate and the cold spray system. In other approaches, a relative motion is created between the substrate and the nozzle and/or the mask, such as by translating the cold spray system and/or mask or the substrate, such that multiple structures, alone or in groups, are deposited to form the array of cold spray-formed structures. Moreover, multiple depositions may be performed, e.g., in sequence, to build complex structures such as those having layers of differing materials, structures having complex 3D shapes, etc. In some aspects, the substrate, nozzle and/or the mask may be translated using a robotic system known in the art as would become apparent to one having ordinary skill in the art upon reading the present disclosure.

In one exemplary approach, at least some of the foregoing structures may be permanent magnets. In another exemplary approach, at least some of the foregoing structures are part of a superconductor. In yet another exemplary approach, at least some of the foregoing structures are part of a piezoelectric device. In yet another exemplary approach, at least some of the foregoing structures are part of a multiferroic device.

In preferred aspects, a dimension of the array in at least one direction is greater than a radius of spray of a cold spray nozzle used to form the structures in the array, which is typically between about 8 mm and about 12 mm, but could be higher or lower. In one approach, a dimension of the array in at least one direction is greater than 20 mm. In some approaches, the dimension of the array in at least one direction is influenced by at least the positioning control and/or the application requirements as would become apparent to one having ordinary skill in the art upon reading the present disclosure.

In some approaches, some or all of the structures in an array of structures include a change in composition, as discussed elsewhere herein, and/or immediately below.

Figure 3B:
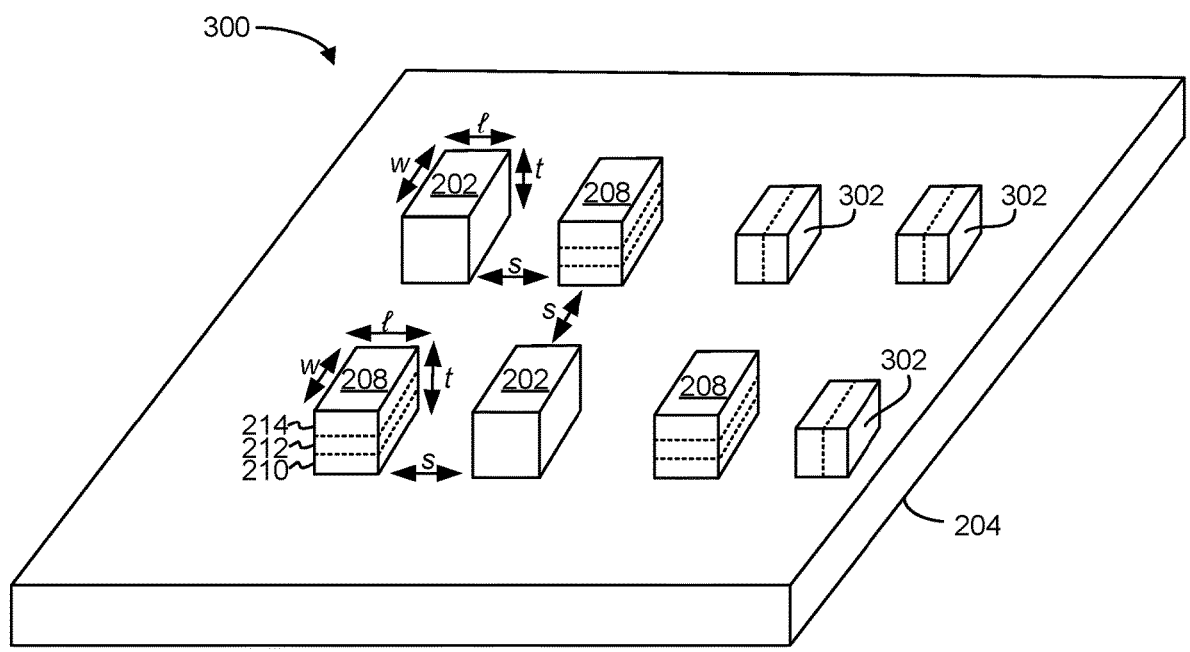
FIG. 3B is a perspective view of an exemplary product comprising an array of cold spray-formed structures, according to one aspect of an inventive concept.

To exemplify, FIG. 3B depicts an exemplary product 300 comprising an array of cold spray-formed structures of varying type. As an option, the present product 300 may be implemented in conjunction with features from any other embodiment listed herein, such as those described with reference to the other FIGS. Of course, however, such product 300 and others presented herein may be used in various applications and/or in permutations which may or may not be specifically described in the illustrative embodiments listed herein. Further, the product 300 presented herein may be used in any desired environment.

In the example shown in FIG. 3B, the array of cold spray-formed structures includes structures 202 interleaved with cold spray-formed structures 208 and 302. The structures 208 and 302 have different compositions than structures 202.

As exemplified by FIG. 3B, in some approaches, some or all of the structures 208 in an array of structures include a change in composition along a thickness thereof, e.g., as described above with reference to FIG. 2B. The change in composition may be along a deposition thickness thereof (see FIG. 2B, thickness, t).

As depicted in the example of FIG. 3B, the array of structures includes structures 208 where the structures 208 comprise portions (e.g., portion 210, portion 212, and portion 214) which may be any combination of compositions as described with reference to FIG. 2B. The structures 208 of the second array are interleaved with the structures 202 of the first array to form a "checkerboard" pattern having different compositions which alternate and are offset within a grid of the structures. The structures are deposited on the substrate 204 via a cold spray system as described above having a nozzle and a mask which defines the boundaries of the fine-featured, cold spray-formed structures 202 and structures 208.

In at least one other approach, the change in composition along a thickness thereof is generally sharp from one material to another, e.g., between at least 2 layers, between each of the 3 layers, or any number of transitions between different materials.

However, in at least one approach, the change in composition along a thickness thereof is gradual, e.g., formed by altering the composition of the material during deposition. For example, a gradient of concentration of a particular component may be created by gradually increasing or decreasing the concentration in that component in the material during deposition.

In other approaches, some or all of the structures 302 in the array may have a change in composition in a lateral direction, created, e.g., by forming a first portion, and then forming a second portion adjacent thereto, e.g., by shifting the lateral position of the substrate slightly.

Figure 3C:
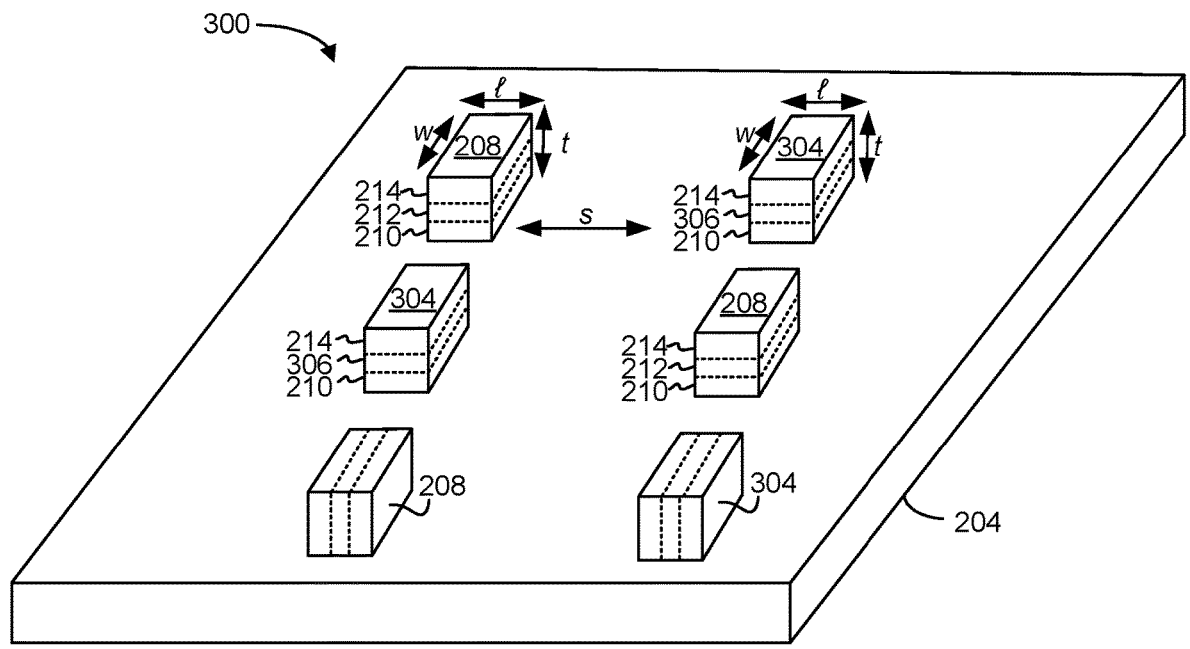
FIG. 3C is a perspective view of an exemplary product comprising an array of cold spray-formed structures, according to one aspect of an inventive concept.

FIG. 3C depicts an exemplary product 300 comprising an array of cold spray-formed structures of varying type. As an option, the present product 300 may be implemented in conjunction with features from any other embodiment listed herein, such as those described with reference to the other FIGS. Of course, however, such product 300 and others presented herein may be used in various applications and/or in permutations which may or may not be specifically described in the illustrative embodiments listed herein. Further, the product 300 presented herein may be used in any desired environment.

In the example shown in FIG. 3C, the array of cold spray-formed structures includes cold spray-formed structures 208 interleaved with cold spray-formed structures 304. The structures 208 and 304 have different compositions.

As exemplified by FIG. 3C, in some approaches, some or all of the structures 208 in an array of structures include a change in composition along a thickness thereof, e.g., as described above with reference to FIG. 2B. The change in composition may be along a deposition thickness thereof (see FIG. 2B, thickness, t). In some approaches, some or all of the structures 304 in an array of structures include a change in composition along a thickness thereof, e.g., as described above with reference to FIG. 2B. The change in composition may be along a deposition thickness thereof (see FIG. 2B, thickness, t).

As depicted in the example of FIG. 3C, the array of structures includes structures 208 where the structures 208 comprise portions (e.g., portion 210, portion 212, and portion 214). As depicted in the example of FIG. 3C, the array of structures includes structures 304 where the structures 304 comprise portions (e.g., portion 210, portion 306, and portion 214).

In one exemplary approach, the array of structures comprising cold spray-formed structures 208 and 304 form a thermoelectric generator, or similar device, as would become apparent to one having ordinary skill in the art. Specifically, portion 210 and portion 214 of each structure may be protection (e.g., insulation) and/or connection layers. Portion 212 and portion 306 of structures 208 and structures 304, respectively, may be thermoelectric layers where portion 212 of each structure 208 may be a p-type thermoelectric and portion 306 of each structure 304 may be a n-type thermoelectric, or vice versa. A p-type thermoelectric may include $Sb_2Te_3$-doped $Bi_2Te_3$ or any p-type thermoelectric known in the art. A n-type thermoelectric may include $Bi_2Se_3$-doped $Bi_2Te_3$ or any other n-type thermoelectric known in the art. These thermoelectric generator products are advantageously formed using the masked, cold spray techniques described herein to deposit many stacks of the same material (e.g., a first portion 210) on a first pass, followed by a pass over the stacks for each of the p-types (e.g., portion 212) and the n-types (e.g., portion 306) to be deposited. Further, the thermoelectric products formed herein maintain the flexibility and microstructure preservation as other cold spray-formed fine features described herein.

In preferred approaches, at least some of the portions of structures 208 and structures 304 may include different thermoelectrics for use with different temperature operating windows (e.g., different temperature ranges). For example, the portions of the structures 208 and structures 304 may be tuned for optimal performance across a temperature gradient as would become apparent to one having ordinary skill in the art upon reading the present disclosure.

In other approaches, at least some of the portions 212 and portions 306 of structures 208 and structures 304, respectively, may be materials which are suitable for thermophotovoltaic (TPV) products. For example, at least some portions of any of the structures described herein may include materials which are suitable for energy conversion from heat to electricity via photons, as would be determinable by one having ordinary skill in the art upon reading the present disclosure. In one aspect, a product comprising an array of fine features having the foregoing properties may be a TPV product.

In some approaches, a thermoelectric generator may be formed by stacking a structure 304 onto each structure 208 (not shown) and connected in parallel to generate electricity from a thermal gradient as would become apparent to one having ordinary skill in the art upon reading the present disclosure.

In at least some approaches, structures 304 and structures 208 may have a change in composition in a lateral direction, as shown in the last row (e.g., the bottom-most, third row) of structures in FIG. 3C. The change in composition in a lateral direction may be created, e.g., by forming a first portion, and then forming a second portion adjacent thereto, and then forming a third portion adjacent thereto, e.g., by shifting the lateral position of the substrate slightly. In one approach, structures 304 and structures 208 having a lateral change in composition may be used to build a thermoelectric generator product, depending on the direction of heat flux, in view of the intended application, as would become apparent to one having ordinary skill in the art upon reading the present disclosure.

The structures 208 of the second array are interleaved with the structures 304 of the first array to form a "checkerboard" pattern having different compositions which alternate and are offset within a grid of the structures. The structures are deposited on the substrate 204 via a cold spray system as described above having a nozzle and a mask which defines the boundaries of the fine-featured, cold spray-formed structures 208 and structures 304.

Figure 3D:
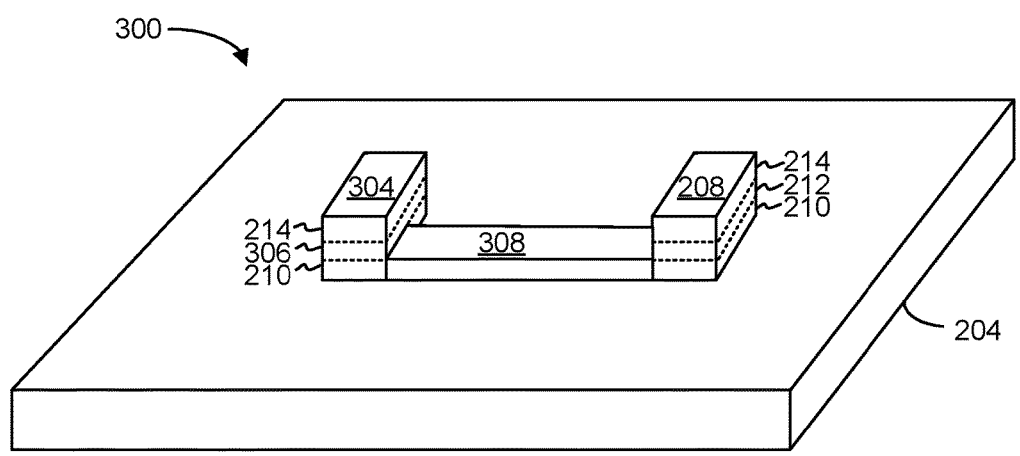
FIG. 3D is a perspective view of an exemplary product comprising an array of cold spray-formed structures, according to one aspect of an inventive concept.

FIG. 3D depicts an exemplary product 300 comprising an array of cold spray-formed structures of varying type. As an option, the present product 300 may be implemented in conjunction with features from any other embodiment listed herein, such as those described with reference to the other FIGS. Of course, however, such product 300 and others presented herein may be used in various applications and/or in permutations which may or may not be specifically described in the illustrative embodiments listed herein. Further, the product 300 presented herein may be used in any desired environment.

In the example shown in FIG. 3D, the array of cold spray-formed structures includes an exemplary cold spray-formed structure 208 and an exemplary cold spray-formed structure 304, as described above with reference to FIG. 3C. In this example, a connection 308 may be deposited between the structures 208 and 304. In one approach, the connection 308 may be deposited before or after the structures 208 and 304 are deposited. In one aspect, the connection 308 may be a metal layer deposited between the structures 208 and 304 in a thermoelectric product as would be understood by one having ordinary skill in the art upon reading the present disclosure. In some approaches, a metal layer connection may be deposited using additive manufacturing techniques known in the art. In other approaches, a metal layer connection may be deposited by modifying the templated cold spray deposition methods described herein.

It should become apparent to one having ordinary skill in the art upon reading the present disclosure that the structures in the array may be deposited in any order. It should further become apparent to one having ordinary skill in the art upon reading the present disclosure that a mask may be used to create the first array of structures and then the same mask (and/or the nozzle) may be physically translated to create the second array of structures. In other aspects, a different mask may replace the mask used to create the first array of structures when forming other types of structures. Any number of arrays of cold spray-formed structures, and any combination of types of structures therein, may be deposited onto the substrate as would become apparent to one having ordinary skill in the art upon reading the present disclosure.

Thus, the various types of structures may be interleaved with one another to form a predefined pattern having different compositions arranged periodically, offset, alternating, in a "checkerboard" arrangement, adjacent one another as in structures 302, etc., within a grid of the structures. In one exemplary aspect, the array is part of a thermoelectric device.

Referring again to cold spray-formed structures described herein in general, in one aspect, at least some of the structures have an aspect ratio of orthogonal dimensions in the plane of deposition thereof, e.g., $\ell$ to w, that is at least 2:1. In one exemplary approach, the foregoing structures may be permanent magnets such as $Nd_2Fe_{14}B$, $SmCo_5$, etc. For example, fine features formed according to at least some of the various aspects described herein may be characterized by having a relatively shorter axis in a dimension orthogonal to the longitudinal axis in the plane of deposition of the structure. The magnet's shape anisotropy may be leveraged to enhance the magnetic performance of the structure and/or a resulting product comprising the structure. In another exemplary approach, the foregoing structures are part of a superconductor.

Shapes for the cold spray-formed fine features should not be deemed to be limited to the shapes shown in FIGS. 2A-3D. It should be understood by one having ordinary skill in the art that the cold spray deposition techniques using mask(s) to template fine features may be used to produce any shape known in the art. For example, the cold spray-formed fine features may include any 3-dimensional (3D) shape conceivable to one having ordinary skill in the art for any application. Exemplary shapes may include cuboids, rectangular cuboids, right cuboids, rectangular boxes, rectangular hexahedrons, right rectangular prisms, rectangular parallelepipeds, irregular shapes, wedges, long and thin rods, circles, rings, arcs, curves, interlocking arcs, disks, bowls, hearts, semi-hearts, antenna shapes, radio-frequency identification (RFID) shapes, split ring resonator shapes, etc. As would be understood by one having ordinary skill in the art in view of the present disclosure, the cold spray deposition techniques described herein may be used to form singular fine features or an array thereof. An array may include all of the same fine feature shapes or any combination of fine feature shapes described herein.

Figure 4A:
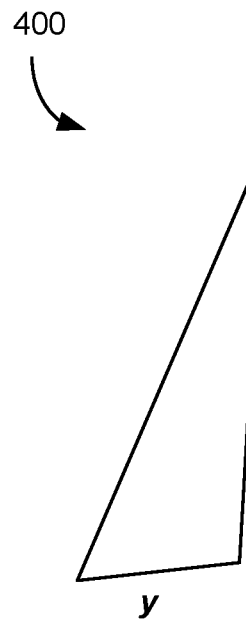
FIG. 4A is a top down view perpendicular to the plane of deposition of an exemplary cold spray-formed fine feature, according to one aspect of an inventive concept.

FIG. 4A is a top down view perpendicular to the plane of deposition of an exemplary cold spray-formed fine feature 400, according to one aspect of an inventive concept. As shown, FIG. 4 includes an irregular shape. Irregular shapes may be formed as wedges (e.g., having varying thicknesses which are perpendicular to the plane of deposition), in some approaches. In at least some approaches, any shape disclosed herein may be include a cold spray-formed surface which is irregular (e.g., comprising bumps, valleys, pyramids, etc., along a surface thereof). In other approaches, any irregular shape which is formed using cold spray deposition in combination with a mask may include a substantially parallel surface to the plane of deposition.

As shown, the irregular shape comprises a measurement, x, where x may be about 10 microns. In contrast, the irregular shape comprises a measurement, y, where y may be about 1 centimeter (cm) across, or greater than about 1 cm across, in some approaches.

Figure 4B:
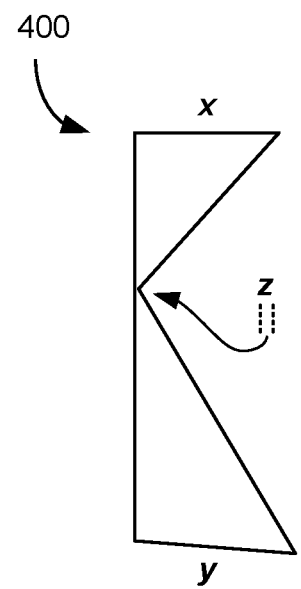
FIG. 4B is a top down view perpendicular to the plane of deposition of an exemplary cold spray-formed fine feature, according to one aspect of an inventive concept.

FIG. 4B is a top down view perpendicular to the plane of deposition of an exemplary cold spray-formed fine feature 400, according to one aspect of an inventive concept. As shown, FIG. 4 includes an irregular shape. As shown, the irregular shape comprises a measurement, x, where x may be about 1 cm across or greater than about 1 cm across, in some approaches. The irregular shape comprises a measurement, y, where y may be about 1 cm across or greater than about 1 cm across, in some approaches. The irregular shape comprises an additional measurement, z, where z may be about 10 microns across, in some approaches.

Figure 4C:
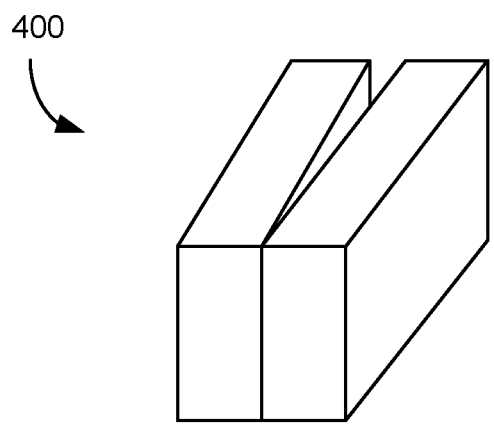
FIG. 4C is a perspective view of an exemplary cold spray-formed fine feature, according to one aspect of an inventive concept.

FIG. 4C is a perspective view of an exemplary cold spray-formed fine feature 400, according to one aspect of an inventive concept. As shown, FIG. 4 includes an irregular shape. The irregular shape is an exemplary shape for use in a thermopile comprising laterally joined, cold spray-formed fine features. For example, the thermopile, as shown, comprises at least two cold spray-formed fine features which are joined at one end. In one approach, each cold spray-formed fine feature includes a different material. As in the thermopile example, one cold spray-formed fine feature may include a p-type thermoelectric and the other cold spray-formed fine feature may include an n-type thermoelectric as would become apparent to one having ordinary skill in the art upon reading the present disclosure.

In other approaches, any of the shapes described in FIGS. 4A-4C may be used, singularly or in combination, in antenna applications, magnet applications, striplines (e.g., including, but not limited to, inductor components, capacitor components, etc.), etc.

Figure 5B:
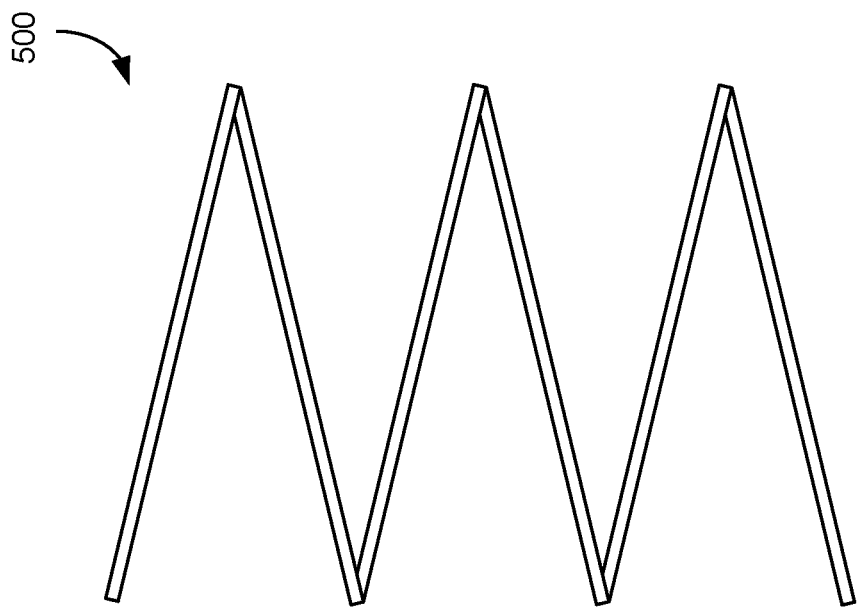
FIG. 5B is a top down view perpendicular to the plane of deposition of an array of exemplary cold spray-formed fine features, according to one aspect of an inventive concept.
Figure 5A:
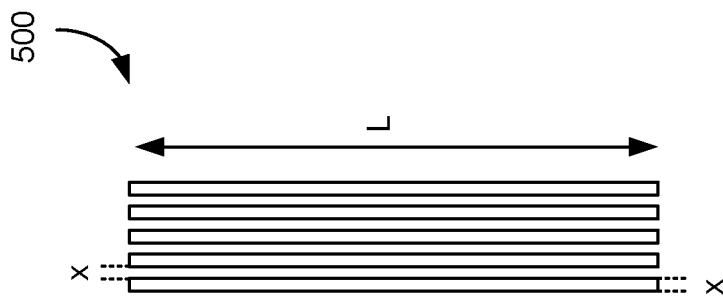
FIG. 5A is a top down view perpendicular to the plane of deposition of an array of exemplary cold spray-formed fine features, according to one aspect of an inventive concept.

FIG. 5A is a top down view perpendicular to the plane of deposition of an array of exemplary cold spray-formed fine features 500, according to one aspect of an inventive concept. FIG. 5A shows an exemplary product comprising an array of long and thin rods. Specifically, the exemplary product includes an array of microstructures having an extreme aspect ratio. In one exemplary approach, at least one of the rods in the array may be a permanent magnet having a relatively shorter axis in a dimension orthogonal to the longitudinal axis in the plane of deposition of the structure. The cold spray-formed fine feature's shape anisotropy may be leveraged to enhance the magnetic performance of the structure and/or a resulting product comprising the structure.

As shown, the array of exemplary cold spray-formed fine features comprises a measurement, x, where x may be about 10 microns. This measurement, x, may be of a dimension orthogonal to the longitudinal axis in the plane of deposition of each structure, in some approaches. The measurement, x, may also apply to a separation along the plane of deposition of the cold spray-formed fine features in the array, in at least some other approaches.

FIG. 5B is a top down view perpendicular to the plane of deposition of an array of exemplary cold spray-formed fine features 500, according to one aspect of an inventive concept. FIG. 5B shows an exemplary product comprising an array of long and thin rods which are connected at alternating ends (e.g., in a "zigzag" pattern). In one exemplary approach, the array of exemplary cold spray-formed fine features are connected into a thermopile where alternating rods include p-type and n-type thermoelectics as would become apparent to one having ordinary skill in the art upon reading the present disclosure. For example, a p-type thermoelectric may include $Sb_2Te_3$-doped $Bi_2Te_3$ or any p-type thermoelectric known in the art and an n-type thermoelectric may include $Bi_2Se_3$-doped $Bi_2Te_3$ or any other n-type thermoelectric known in the art. In one approach, a heat flux from left to right along the thermopile may generate a voltage due to the Seebeck effect. The foregoing thermopile design is of interest for many thermoelectric applications.

In other approaches, any of the shapes described in FIGS. 5A-5B may be used, singularly or in combination, in other thermopile designs, heater applications, permanent magnets, strain gauges, permanent magnets applications, etc.

Figure 6:
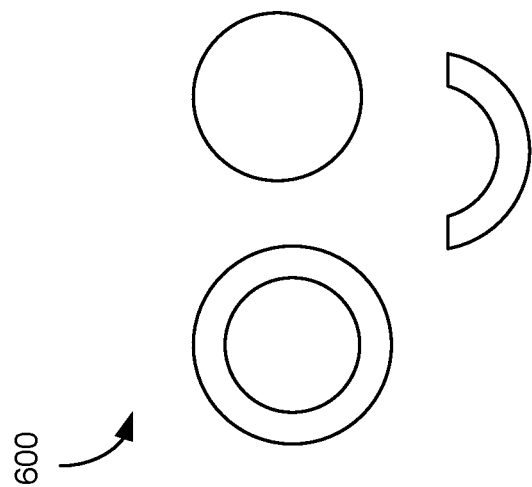
FIG. 6 is a top down view perpendicular to the plane of deposition of exemplary cold spray-formed fine features, according to one aspect of an inventive concept.

FIG. 6 is a top down view perpendicular to the plane of deposition of exemplary cold spray-formed fine features 600, according to one aspect of an inventive concept. As shown, FIG. 6 includes an exemplary ring shape, an exemplary circular shape, and an exemplary arc shape. As would be understood by one having ordinary skill in the art in view of the present disclosure, the exemplary ring structure may include an empty inner portion, an inner portion which is the same material as the outer portion (e.g., a disc (circular) shape), an inner portion which is different from the outer portion, different compositions along the circumference of the shape of the exemplary ring, etc. Further, in other approaches, the rings and/or arcs may be imperfect rings and/or arcs according to the intended application of the fine features as would be determinable by one having ordinary skill in the art upon reading the present disclosure.

Figure 7:
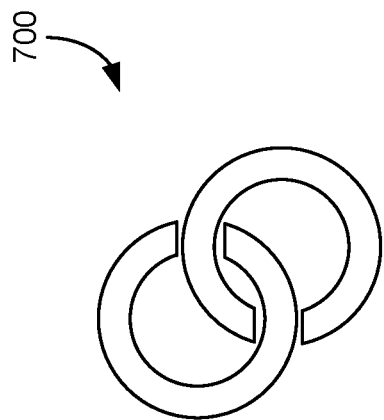
FIG. 7 is a top down view perpendicular to the plane of deposition of exemplary cold spray-formed fine features, according to one aspect of an inventive concept.

FIG. 7 is a top down view perpendicular to the plane of deposition of exemplary cold spray-formed fine features 700, according to one aspect of an inventive concept. As shown, FIG. 7 includes exemplary interlocking, arc shapes. In some approaches, the arc shapes may be nested arc shapes such that arcs are positioned in a hierarchical structure within one another. In further approaches, the thickness of each of the shapes may be the same or different according to the intended application as would become apparent to one having ordinary skill in the art upon reading the present disclosure.

In various approaches, any of the shapes described in FIGS. 6 and 7 may be used, singularly or in combination, in permanent magnet motor applications, other magnet applications including relatively thin magnets, superconductors (e.g., including, but not limited to, bearings, electromagnets, etc.), components having spectrally specific surfaces, etc. In various approaches, superconductor products may include YBCO, BSCCO, etc.

Figure 11:
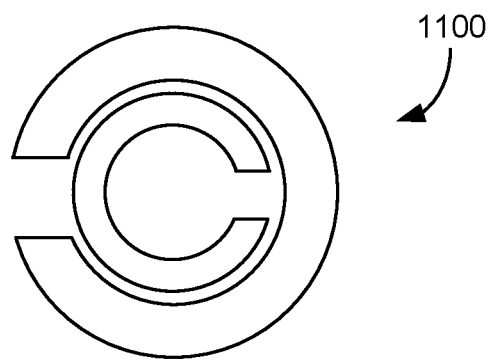
FIG. 11 is a top down view perpendicular to the plane of deposition of exemplary cold spray-formed fine features, according to one aspect of an inventive concept.

It should be understood that the exemplary shapes for the cold spray-formed fine features shown in FIGS. 4A-7, and others described herein, may be used alone or in combination with any number of other shapes described herein to form products based on the intended application as would become apparent to one having ordinary skill in the art upon reading the present disclosure. For example, the arc and/or interlocking ring shapes shown in FIGS. 6 and 7 may be modified and/or combined to form the exemplary split ring resonator product as shown in FIG. 11 as would become apparent to one having ordinary skill in the art upon reading the present disclosure.

FIG. 8 is a top down view perpendicular to the plane of deposition of an exemplary cold spray-formed fine feature 800, according to one aspect of an inventive concept. As shown, FIG. 8 includes a long, thin rod having an extreme aspect ratio as described in detail above. The cold spray-formed fine feature in the shape of a rod includes a compositional gradient from Material A to Material B starting at a first end through the rod to a second end, or vice versa. In one approach, the gradient of a concentration of Material A may be created by gradually decreasing the concentration of Material A in the rod and gradually increasing the concentration of Material B in the rod during deposition, or vice versa.

The compositional gradient should not be deemed limited to including two materials (as shown). In various approaches, the compositional gradient may include at least two materials, at least three materials, etc. In some approaches, the compositional gradient may alternate between materials for at least two transitions (e.g., (1) Material A to Material B, and (2) Material B back to Material A), for at least three transitions, etc.

As would become apparent to one having ordinary skill in the art upon reading the present disclosure, the compositional gradient of the cold spray-formed fine feature may include a functional gradient (e.g., a change in functional properties along the gradient). For example, the compositional gradient of the cold spray-formed fine feature in RF applications may influence the ability of the cold spray-formed fine feature to change from one impedance to another impedance (e.g., for avoiding mismatches) and would advantageously result in less reflection. The ability to modify the composition of the raw materials to be sprayed during cold spray deposition quickly and efficiently is further beneficial for implementing the compositional gradient.

In various approaches, the overlap in materials comprising the compositional gradient as shown in exemplary FIG. 8 may be tuned to influence the conductivity of the material and for implementing a gradual change in functional properties, as would become apparent to one having ordinary skill in the art upon reading the present disclosure.

The foregoing compositional gradient and/or functional gradient may be applied to any of the shapes described herein as would become apparent to one having ordinary skill in the art upon reading the present disclosure.

FIG. 9 is a top down view perpendicular to the plane of deposition of an exemplary cold spray-formed fine feature

900, according to one aspect of an inventive concept. As shown, FIG. 9 includes an exemplary RFID antenna.

FIG. 10 is a top down view perpendicular to the plane of deposition of an exemplary cold spray-formed fine feature 1000, according to one aspect of an inventive concept. As shown, FIG. 10 includes an exemplary meandered inverted F antenna.

In various approaches, any of the shapes described in FIGS. 9 and 10 may be used, singularly or in combination, in other antenna designs, receiving RF components, RFID tags, superconductors, etc. For example, superconducting materials may be combined with other, non-superconducting materials to form e.g., superconducting quantum interference devices (SQUIDs), Josephson junctions, etc. In some approaches, products including any of the shapes described in FIGS. 9 and 10 may be cold spray-formed in multiple layers (e.g., of superconducting and non-superconducting materials) to form superconducting devices.

In other approaches, some superconducting devices may be formed by cold spraying at least one layer of fine features and adding other layers using different additive manufacturing techniques, the layers being formed in any order. For example, a superconducting product may include at least one layer formed by a plasma deposition process and at least one other layer including cold spray-formed fine features as described herein.

In various aspects, templated cold spray-formed fine features as described herein may be used in conjunction with any other additive manufacturing technique known in the art to produce products as would become apparent to one having ordinary skill in the art upon reading the present disclosure.

In at least some approaches, the compositional gradient as exemplified in FIG. 8 may be used in conjunction with any of the shapes of FIGS. 9 and 10 for forming superconductor products. For example, a first material may include a traditional superconductor (e.g., yttrium barium copper oxide) and a second material may include a conventional conductor (e.g., copper). The cold spray deposition of the compositional gradient would improve the current injection and thermalization to manage thermal gradients. In one approach, the conventional conductor may be deposited by a different additive manufacturing technique and the superconductor material may be cold spray-formed on top of the conventional conductor.

In various aspects, one having ordinary skill in the art would prefer to use products including the cold spray-formed fine features described herein over products including features formed by other additive manufacturing processes (e.g., sputtering). For example, one having ordinary skill in the art would appreciate that cold spray-formed fine features as described herein may be formed substantially quicker using cold spray deposition than formation using other sputtering techniques. Specifically, sputtering may deposit materials at approximately 3-10 microns an hour (e.g., a 100 micron-sized feature may take multiple days to deposit) whereas a cold spray-formed fine feature of similar size may be advantageously deposited in a relatively smaller time period.

A mask as described above may be used to form antennas or any other products which are then quickly and efficiently templated through cold spray processes into arrays of these fine feature shapes, in some approaches. The cold spray-formed features described herein may be used in various applications known in the art as would become apparent to one having ordinary skill in the art in view of the present disclosure.

FIG. 11 is a top down view perpendicular to the plane of deposition of exemplary cold spray-formed fine features 1100, according to one aspect of an inventive concept. As shown, FIG. 11 includes an exemplary split ring resonator.

In various approaches, any of the shapes described in FIG. 11 may be used, singularly or in combination, to form compounded components including metallic and non-metallic materials for reducing RF build-up in certain frequency bands in various applications. For example, materials of these exemplary products may be tuned for predetermined frequency bands (e.g., for targeting frequency bands where conventional materials are not applicable) as would be determinable by one having ordinary skill in the art upon reading the present disclosure.

Figure 12:
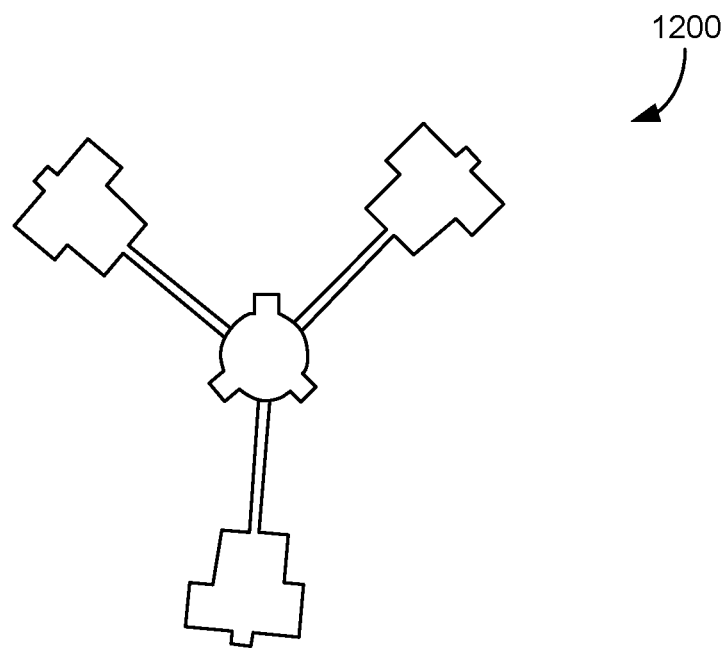
FIG. 12 is a top down view perpendicular to the plane of deposition of an exemplary cold spray-formed fine feature, according to one aspect of an inventive concept.

FIG. 12 is a top down view perpendicular to the plane of deposition of an exemplary cold spray-formed fine feature 1200, according to one aspect of an inventive concept. As shown, FIG. 12 includes an exemplary shape for use in a soft magnet, ferrite, RF applications, etc., as would become apparent to one having ordinary skill in the art upon reading the present disclosure. In various approaches, the exemplary shape may be used as a circulator in microelectronics. Cold spray deposition of these exemplary shapes is particularly useful for applications using these fine features on complex substrates and/or for deposition of the fine features over a wide area quickly and efficiently compared to other additive manufacturing techniques.

Figure 13:
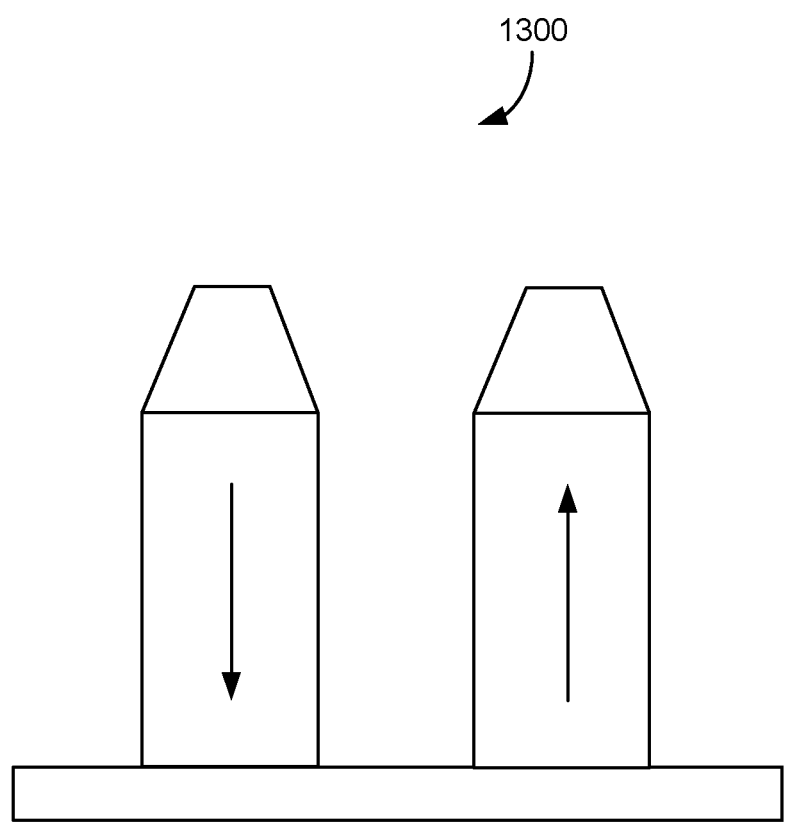
FIG. 13 is a side view parallel to the plane of deposition of exemplary cold spray-formed fine features, according to one aspect of an inventive concept.

FIG. 13 is a side view parallel to the plane of deposition of exemplary cold spray-formed fine features 1300, according to one aspect of an inventive concept. As shown, FIG. 13 includes exemplary pole pieces of a soft magnet. For example, the soft magnet may include NiFe as a back iron return path. In another approach, the pole pieces may be of NdFeB permanent magnet having aligned magnetization. In various approaches, the "caps" on top of the pole pieces as shown and the plate piece may include soft magnets such as silicon steel, Metglas, etc., which act as flux paths to guide the flux. The flux may be focused at the top of the pole pieces to get higher localized fields. In another approach, FIG. 13 may show a top down view perpendicular to the plane of deposition of exemplary cold spray-formed fine features, depending on the intended application, as would become apparent to one having ordinary skill in the art upon reading the present disclosure.

In various approaches, any of the shapes described in FIG. 13 may be used, singularly or in combination, to form motors, actuators, supporting structures in magnetic active components for guiding the flux lines (e.g., focusing the flux lines to minimize stray fields), position sensors (e.g., based on a detected field from the fine feature or an array of fine features), constant reluctance motors, resolver devices, etc.

In various approaches, the cold spray method as described herein advantageously provides the ability to reduce an amount of process steps to produce a product as compared to conventional, multi-step processes known in the art. For example, in a product comprising magnetic and electric components, a conventional process may require that each step be performed separately (e.g., at different times) and further steps for joining the components (e.g., gluing the components) are additionally performed separately. Using the templated cold spray method as described herein, a similar product comprising magnetic and electric components may be sprayed and joined in a single process step as would become apparent to one having ordinary skill in the art upon reading the present disclosure. Further, cold spray-formed magnetic and electric components (as well as any other cold spray-formed fine features described herein) may be joined and/or formed without adhesives or binders, thereby negating various structural concerns associated with conventional designs and processes.

In various approaches, the cold spray method as described herein causes the particles of the precursor powder to adhere to a substrate without changing the microstructure of the particles and the substrate after impact. A microstructure that may be characterized by at least one property, where the at least one property may be substantially the same (e.g., greater than 90%) as a corresponding property of the precursor powder. For example, in a magnetic material, the property may include remnant magnetization, coercivity, density, etc., and at least one of these properties may be substantially the same as the remnant magnetization, coercivity, density, etc., of the precursor magnetic powder used to form the material.

In various approaches, the product may have a composition of thermoelectric materials, magnetic materials, ferroic materials, multiferroic materials, composite of multiferroic materials, magnetocaloric materials, ionic materials, including ionic semiconductors, etc., etc.

In various approaches, the products described herein may include ferroics. Ferroics are classes of materials that respond strongly to external stimuli, such as an applied field. A ferromagnet is a material that has switchable magnetism by an applied magnetic field. A ferroelectric material has switchable electric polarization by an applied electric field. A ferroelastic material has switchable deformation by applied stress. A ferrotoroidic material may also be a ferroic material which has switchable ordered magnetic vortices. Ferroics may include ferrocholorics in some approaches.

In one aspect, high-aspect ratio (length to width) permanent magnets (e.g., NdFeB) may be fabricated. Here, the preference of the net magnetization to align with the long axis is exploited to produce a preferred axis of magnetization. When combined with the existing magnetocrystalline anisotropy this can enhance the coercivity of the magnet, increasing its resistance to external fields or elevated temperatures.

In another aspect, high aspect ratio superconductors (e.g., YBCO) may be fabricated. The demagnetization tensor leads to significantly enhanced magnetization in response to an external field when the field is aligned along a short axis of the superconductor. Enhancements of magnetization a factor of several thousand can be achieved in this way. The demagnetization factor (e.g., the amount of flux which is excluded from the superconductor) may be tuned depending on the shape and the aspect ratio of the deposited material. A superconductor may include cold spray-formed fine features having a shape including coils, rings, disks, bowls, thin films, etc. For example, cold spray-formed fine feature coils and/or rings may be used to fabricate superconducting magnets. In another example, cold spray-formed fine feature disks and/or bowls may be used to fabricate superconducting bearings. In yet another example, superconductors may include thin films used for charged particle shielding.

In another aspect, periodic masks may be used to create an array of micron-scale elements of a thermoelectric generator. For example, p-type and n-type powders may be alternately sprayed from the nozzle, or from multiple nozzles, and the mask is translated between depositions. A grid of p-type and n-type blocks may be deposited. In some approaches, different p-type powder(s) may be sprayed on the p-type blocks to create layered p-type blocks where each layer has a different composition. Similarly, different n-type powder(s) may be sprayed on the n-type blocks to create layered n-type blocks where each layer has a different composition. The variation in composition in the p-type blocks and/or the n-type blocks may be tuned to maximize heat harvesting across a temperature profile (e.g., a temperature operating window). In some approaches, a second mask is used to deposit electrically conducting connector layers and/or insulating barriers, to create an integrated thermoelectric generator. A large area thermoelectric generator may be deposited on a complex surface, without the requirement for either dicing the blocks or adhesive to attach them to the hot surface.

In various approaches, a thermoelectric device may be a Peltier device which transfers heat from one side of the device to the other. The consumption of electrical energy depends on the direction of the current. The Peltier device may be a cooler, heater, thermoelectric heat pump, thermoelectric cooler (TEC), etc., which may be used for heating or cooling. In other approaches, the thermoelectric device may be a thermocouple which produces a temperature-dependent voltage as a result of the thermoelectric effect. The voltage may be used to measure temperature in some approaches. The cold spray deposition using mask(s) as described herein may be used to fabricate thermoelectric devices comprising thermopiles including arrays of thermocouples as would become apparent to one having ordinary skill in the art upon reading the present disclosure.

In one approach, a product may include multiferroic materials. Multiferroics are a suite of materials, and material combinations, which respond strongly to multiple external fields. For example, one type of multiferroic material may be simultaneously ferromagnetic and ferroelectric. Multiferroic materials may be used as actuators, sensors, transducers, etc. For example, applications of ferroics may be used in areas such as switches (actuators), current sensors (sensors), energy harvesting (transducers), etc.

Multiferroic materials as used throughout the present disclosure may refer to standard multiferroics and/or composite multiferroics. A standard multiferroic may include any material that exhibits more than one of the primary ferroic properties in the same phase (e.g., ferromagnetism (a magnetization that is switchable by an applied magnetic field), ferroelectricity (an electric polarization that is switchable by an applied electric field), and ferroelasticity (a deformation that is switchable by an applied stress)). Exemplary standard multiferroic includes bismuth-ferrite, $YMnO_3$, $TbMnO_3$, etc.

Multiferroics may also refer to composite multiferroics comprising at least two dissimilar materials. According to one aspect, composite multiferroics may be used to form products according to the various approaches described herein. In one approach, cold spray-formed structures of composite multiferroics may be obtained by producing a homogenized mixture of multiple species and depositing the mixture from a single nozzle in cold spray deposition. In another approach, cold spray-formed structures of composite multiferroics may be obtained by spraying each material from a different nozzle (e.g., at least two nozzles) for synchronously depositing particles.

In yet another approach, cold spray-formed feature products of composite multiferroics may be obtained by sequential spraying, where a thin layer of the first species is deposited, followed by a layer of the second species, and repeated with alternating layers of any number of species until the desired thickness is obtained. In one approach, cold spraying of layers may generate a concentration gradient of a multiferroic material. In one approach, a defined pattern may be generated during cold spraying of at least two multiferroic materials. In various approaches, an approach of cold spraying multiferroic materials may be determined by the multiferroic material components and their properties. These approaches are by way of example only and are not meant to be limiting in any way.

In one approach, the method of cold spray deposition allows the formation of thin layers, where the thickness of each layer may be at least the diameter of the average particle being deposited. In one approach, the method of cold spray deposition may include depositing a second powder onto the substrate, where the powder and the second powder have a different composition. In one approach the powder and the second powder may have at least one different property.

Another example of a multiferroic material is a piezoelectric material that generates an electric charge in response to applied mechanical stress. An example of a piezoelectric material is lead zirconate titanate (PZT) which changes shape when an electric field is applied to the material, or conversely an electric field is generated when stress is applied to the material. Piezoelectric materials have applications in production and detection of sound, generation of high voltages, etc. Piezoelectric materials, especially products comprising piezoelectric materials formed by the various aspects of the present disclosure, may be used in strain gauges.

In one approach, the product comprises at least one thermoelectric component and at least one piezoelectric component. In some approaches, the product may include composites of multiferroics in order to enable additional features originating from each multiferroic material of the composite. An example of a combination of multiferroics is a combination of a magnetostrictive material (ferromagnetic and ferroelastic) with a piezoelectric material (ferroelastic and ferroelectric) which may lead to a magnetoelectric composite (a magnetic field generates an electric field). In preferred approaches, composites include thorough mixing of the components to form fully dense parts to ensure excellent interparticle bonding.

In one approach, a composite of multiferroics including a mixture of Terfenol-D and PZT may result in a material that, when a magnetic field is applied the Terfenol-D, stretches in response to the magnetic field which would then cause the PZT to stretch and generate an electric field. Thus, application of a magnetic field on the combination of multiferroic material results in the generation of an electric field. According to one approach, a composite is a mixture of different multiferroic materials that would enable application of one type of field to generate another type of behavior of the material.

In more approaches, the product may include a tunable inductor and/or a tunable capacitor where, for the tunable capacitor, the capacitance may be affected by applying an electric field to one part and, for the tunable inductor, the inductance could be changed by how rapidly the magnetization changes in an applied field. Stretching or relaxing the magnetostriction material of the composite could generate a sizeable change of the inductance of the inductor. In one approach, the product may be used in micro-electro-mechanical systems (MEMS), a mechanical electric magnetic sensor, in a small scale, such that the application of energy results in controlling induction. The product may include a tunable conductor. For example, the product may comprise a piezoelectric device of the type described herein coupled to a magnetorestrictive material. By applying an electric field through the piezoelectric device, the magnetization of the magnetorestrictive material may be changed, thereby enabling a tunable inductance.

In various approaches, at least some of the aspects described herein may include additional thermal processing which may include annealing, sintering, etc.

In one aspect, the product may comprise at least one layer of cold-sprayed material which is heat and/or corrosive resistant. The heat and/or corrosive material may be cold-sprayed through the mask in a substantially similar manner as described above for an underlying material and/or an overlying material. In at least some approaches, the cold-sprayed material which is heat and/or corrosive resistant may be incorporated into integrated digital manufacturing as portions of sensors and/or sensor arrays which are advantageously resistant to harsh environments.

The materials used to form any of the devices described herein, e.g., magnets, thermoelectric devices, superconductors, sensors, multiferroics, piezoelectric devices, etc., may be of known type used with the cold spray deposition process described herein. Moreover, design and circuitry, etc., of such devices may be selected based on conventional designs of such devices.

In Use

Various aspects of the present disclosure provide the ability to use high resolution fabrication of functional materials to achieve enhanced device properties without incurring significant additional costs or performance penalties. In addition, cold spray is an extremely fast deposition technique, thereby enabling coating of large areas with functional materials as described herein. High resolution deposition according to the various approaches described herein enables the formation of the products having magnetic, thermoelectric, superconducting properties, etc., as described in detail above. In particular, the high resolution deposition techniques may be used to create high aspect ratio shapes for enhanced magnetic and/or superconducting properties, or that depositing an array of small thermoelectrics offers a more efficient method to harvest heat. The methods for fabricating the foregoing products as described in various aspects of the present disclosure are cost-effective without significant loss of material properties.

The development of high resolution fabrication of fine features as described herein provide the capability for enabling new designs that had previously not been considered due to limitations in fabrication technology. The combination of masking and cold-spray deposition enables tunable properties of function features that were previously unavailable due to conventional cold spray techniques which rely on particles that are larger than the feature size required for effects such as shape anisotropy.

In one approach, loop-shaped fine features may be cold-sprayed through a mask template. The fine-featured loops may be cooled, and a current passed through the coil to generate a magnetic field for a superconducting electromagnet. The various aspects of the present disclosure enable formation of these fine-featured coils which are otherwise inaccessible through any other means. These fine-featured loops may be used in superconductors, quantum computing, nuclear magnetic resonance (NMR) materials, medical imaging (e.g., magnetic resonance imaging (MRI)), etc., to apply a localized magnetic field for detailed imaging purposes, or to prevent the magnetic field from interfering with nearby components that are sensitive to external fields. Other applications include the fabrication of a detection circuit attached to a superconducting quantum interference device (SQUID) sensor, or superconducting shielding of external magnetic fields, as would become apparent to one having ordinary skill in the art upon reading the present disclosure. Exemplary materials for the foregoing applications may include yttrium-barium-copper-oxide, bismuth-strontium-calcium-copper-oxide, etc.

In one exemplary approach, the above described loops and/or coils may be used in various applications to produce very localized magnetic fields which are stronger and are characterized by lower-power/noise than that achieved with conventional wires. It is difficult to make superconducting wire and tape at these scales using conventional techniques. Spraying the loops and/or coils directly as described herein would be beneficial for efficient production of superconducting materials.

In one exemplary aspect, soft magnetic materials (e.g., such as Metglas, silicon-steel family materials, etc.) may be cold sprayed to fabricate fine features for use in passive RF shielding according to at least some approaches of the present disclosure. In some approaches, passive RF shielding may include fabricating metamaterial devices from the soft magnetic materials for mm wave and microwave absorption and/or reflection purposes. Metamaterial devices may use the property of the materials and the shape design to amplify and/or add properties. For example, metamaterial devices produced according to the aspects described herein may include many repeating unit cells for use in shielding. The unit cells preferably comprise the cold spray-formed fine features described herein. In another example, metamaterial devices may include cold spray-formed fine feature, split ring resonators.

In other approaches, soft magnetic materials having low coercivity may be deposited as cold spray-formed fine features and used in inductor cores, magnetic flux path control, and related technology. For example, a soft magnetic material may be deposited in conjunction with a hard magnet having a strong field of magnetism. The soft magnet may be used to guide the magnetic lines and prevent interference of the field. In one aspect, the soft magnetic materials may be used as electrical insulators in transformers to reduce interference and current losses. The ability to maintain the microstructure and functionality of the soft magnetic materials using cold spray deposition is beneficial for magnetic path guidance and control.

In one aspect, the techniques for forming fine features using templated cold spray deposition as described herein may be used to generate very thin structures where a cooling medium (e.g., air) may be flowed through the structures while maintaining the soft magnetic properties. In another aspect, the sequential deposition of the magnet material and an insulator may be used to generate laminations which minimize eddy current heating in various applications.

In other applications, the fine features may be deposited to produce patterned anodes and cathodes. Arrays of cold spray-formed fine features may be deposited in thin layers over a large area such that the material(s) of the fine features may expand and contract in the areas where the material is not sprayed.

In one example, graphite and/or other common battery materials may be deposited in layers on foils using the templated cold spray deposition techniques described herein. Specifically, graphite may be sprayed as a very fine powder into a foil and rolled into pure silicon and/or coated in an elastomeric. The deposited layers may be assembled into batteries using conventional approaches. Graphite and other common battery materials are brittle, functional materials which may be cold sprayed into fine features according to the various approaches described herein.

In other applications, various of the templated cold spray deposition techniques described herein may be used in magnetic refrigeration applications using magnetocalorics. Exemplary materials for these applications include MnFePSi, Gd(Tb,Er), etc. Changes in the magnetic state of the materials are used to absorb heat from the environment and transfer the heat elsewhere. Magnetocaloric refrigerators do not require compressors and similar energy intensive components. Magnetocaloric refrigerators tend to be quieter relative to other conventional refrigerators and potentially provide much longer functional lifetimes. The cold spray-formed fine features having compositions of dissimilar materials onto complex shapes as described herein would be useful for such applications.

In another aspect, arrays of solar cells and/or other light-activated media may be produced having the cold spray-formed fine features. At least some of the approaches described above with reference to thermoelectric generators may be used for these cold-sprayed fine features. In one approach, arrays of layered materials having exemplary geometries designed for the intended application may be produced. In another approach, various approaches described herein may be used to produce thin, layered film coatings onto the structure to fabricate the solar cells and/or other light-activated media.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A product, comprising:
   an array of cold spray-formed structures formed from a raw material, each of the structures, as-formed, being characterized by having:
   a defined feature size in at least one dimension of less than 100 microns as measured in a plane of deposition of the structure,
   at least 90% of a theoretical density of the raw material from which the structure is formed, and
   essentially the same functional properties as the raw material.

2. The product as recited in claim 1, wherein a dimension of the array in at least one direction is greater than a radius of spray of a cold spray nozzle used to form the structures.

3. The product as recited in claim 1, wherein a dimension of the array in at least one direction is greater than 20 mm.

4. The product as recited in claim 1, wherein at least some of the structures include a change in composition along a thickness thereof.

5. The product as recited in claim 4, wherein the at least some of the structures are portions of a thermoelectric device, wherein the different compositions are each tailored to a particular temperature operating window.

6. The product as recited in claim 1, comprising a second array of cold spray-formed second structures interleaved with the structures of the array, the second structures having a different composition than the structures of the array.

7. The product as recited in claim 6, wherein the array and the second array are part of a thermoelectric device.

8. The product as recited in claim 1, wherein at least some of the structures have an aspect ratio of orthogonal dimensions in the plane of deposition thereof that is at least 2:1.

9. The product as recited in claim 8, wherein the at least some of the structures are permanent magnets.

10. The product as recited in claim 8, wherein the at least some of the structures are part of a superconductor.

11. The product as recited in claim 1, wherein at least some of the structures are permanent magnets.

12. The product as recited in claim 1, wherein at least some of the structures are part of a superconductor.

13. The product as recited in claim 1, wherein at least some of the structures are part of a thermoelectric device.

14. The product as recited in claim 1, wherein at least some of the structures are part of a piezoelectric device.

15. The product as recited in claim 1, wherein at least some of the structures are part of a multiferroic device.

16. A product, comprising:
a cold spray-formed structure formed from a raw material, the as-formed cold spray-formed structure characterized by having:
a defined feature size in at least one dimension of less than 100 microns as measured in a plane of deposition of the structure,
at least 90% of a theoretical density of the raw material from which the structure is formed, and
essentially the same functional properties as the raw material.

17. The product as recited in claim 16, wherein the structure includes a change in composition along a thickness thereof, the structure thereby having portions with differing compositions.

18. The product as recited in claim 17, wherein the structure is a portion of a thermoelectric device, wherein the different compositions are each tailored to a particular temperature operating window.

19. The product as recited in claim 16, wherein the structure has an aspect ratio of orthogonal dimensions in the plane of deposition thereof that is at least 2:1.

20. The product as recited in claim 19, wherein the structure is a permanent magnet.

21. The product as recited in claim 19, wherein the structure is part of a superconductor.

22. The product as recited in claim 16, wherein the structure is a permanent magnet.

23. The product as recited in claim 16, wherein the structure is part of a superconductor.

24. The product as recited in claim 16, wherein the structure is part of a thermoelectric device.

25. The product as recited in claim 16, wherein the structure is part of a piezoelectric device.

26. The product as recited in claim 16, wherein the structure is part of a multiferroic device.

* * * * *